(12) United States Patent
Bozorg et al.

(10) Patent No.: US 10,903,798 B2
(45) Date of Patent: Jan. 26, 2021

(54) ULTRAWIDEBAND VERY LOW NOISE AMPLIFIER WITH NOISE REDUCTION AND CURRENT REUSE

(71) Applicant: Short Circuit Technologies LLC, Rochester, NY (US)

(72) Inventors: Amirhossein Ansari Bozorg, Dublin (IE); Robert Bogdan Staszewski, Dublin (IE)

(73) Assignee: Short Circuit Technologies LLC, Rochester, NY (US)

( * ) Notice: Subject to any disclaimer, the term of this patent is extended or adjusted under 35 U.S.C. 154(b) by 0 days.

(21) Appl. No.: 16/238,637

(22) Filed: Jan. 3, 2019

(65) Prior Publication Data

US 2019/0207563 A1    Jul. 4, 2019

Related U.S. Application Data

(60) Provisional application No. 62/613,470, filed on Jan. 4, 2018.

(51) Int. Cl.
  *H03F 1/38*    (2006.01)
  *H03F 1/26*    (2006.01)
  (Continued)

(52) U.S. Cl.
  CPC .............. *H03F 1/26* (2013.01); *H03F 1/56* (2013.01); *H03F 3/19* (2013.01); *H04B 1/7097* (2013.01);
  (Continued)

(58) Field of Classification Search
  CPC ..... H03F 1/26; H03F 1/56; H03F 3/19; H03F 2200/222; H03F 2200/451;
  (Continued)

(56) References Cited

U.S. PATENT DOCUMENTS 8,373,509 B2 *    2/2013    Zeng .................... H03F 1/42
                                                        330/310

OTHER PUBLICATIONS

A. Ansari et al., "A Very Wideband Low Noise Amplifier for Cognitive Radios", IEEE International Conference on Electronics, Circuits, and Systems, 2011, pp. 623-626.

(Continued)

*Primary Examiner* — Khanh V Nguyen
*Assistant Examiner* — Khiem D Nguyen
(74) *Attorney, Agent, or Firm* — Zaretsky Group PC; Howard Zaretsky

(57) ABSTRACT

A novel and useful noise reduction technique that improves the noise figure (NF) of a common-source (CS) low noise amplifier (LNA). The technique exploits dc current reuse and increases transconductance of the CS transistor while maintaining its power consumption. By using noise reduction and dc current reuse techniques, the thermal current noise of the noise cancellation stage is reduced without adding any extra branch to the circuit. As a result, the current thermal noise of second stage decreases dramatically leading to better NF without consuming any extra power. Moreover, since the circuit block is implemented using a pMOS transistor, the second order nonlinearity of pMOS and nMOS transistors cancel each other, resulting in improved nonlinearity performance of the LNA, including improvements to both IIP2 and IIP3.

20 Claims, 10 Drawing Sheets

(51) Int. Cl.
    H03F 1/56      (2006.01)
    H03F 3/19      (2006.01)
    H04B 1/7097    (2011.01)
(52) U.S. Cl.
    CPC .. H03F 2200/222 (2013.01); H03F 2200/294
        (2013.01); H03F 2200/372 (2013.01); H03F
        2200/451 (2013.01); H04B 2201/709709
                                       (2013.01)
(58) Field of Classification Search
    CPC ......... H03F 2200/294; H03F 2200/372; H04B
                            1/7097; H04B 2201/709709
    USPC ............................. 330/291, 277, 251, 207 A
    See application file for complete search history.

(56)             References Cited

OTHER PUBLICATIONS

J.Y. Bae et al., "A CMOS Wideband Highly Linear Low-Noise Amplifier for Digital TV Applications", IEEE Transaction on Microwave Theory and Techniques, vol. 61, No. 10, Oct. 2013, pp. 3700-3711.
S. Bagga et al., "A Frequency-Selective Broadband Low-Noise Amplifier With Double-Loop Transformer Feedback", IEEE Trans. on Circuits and Systems, vol. 61, No. 6, Jun. 2014, pp. 1883-1891.
F. Belmas et al., "A Low Power Inductorless LNA With Double Gm Enhancement in 130 nm CMOS", IEEE J. of Solid-State Circuits, vol. 47, No. 5, May 2012, pp. 1094-1103.
A. Bevilacqua et al., "An Ultrawideband CMOS Low-Noise Amplifier for 3.1-10.6-GHz Wireless Receivers", IEEE J. of Solid-State Circuits, vol. 39, No. 12, Dec. 2004, pp. 2259-2268.
S.C. Blaakmeer et al., "The BLIXER, a Wideband Balun-LNA-I/Q-Mixer Topology", IEEE J. of Solid-State Circuits, vol. 43, No. 12, Dec. 2008, pp. 2706-2715.
S.C. Blaakmeer et al., "Wideband Balun-LNA With Simultaneous Output Balancing, Noise-Canceling and Distortion-Canceling", IEEE J. of Solid-State Circuits, vol. 43, No. 6, Jun. 2008, pp. 1341-1350.
F. Bruccoleri et al., "Noise Cancelling in Wideband CMOS LNAs", IEEE International Solid-State Circuits Conference, Feb. 2002, pp. 406-407.
F. Bruccoleri et al., "Wide-Band CMOS Low-Noise Amplifier Exploiting Thermal Noise Canceling", IEEE J. of Solid-State Circuits, vol. 39, No. 2, Feb. 2004, pp. 275-282.
F. Bruccoleri et al., "Generating All 2-Transistor Circuits Leads to New Wide-Band CMOS LNAs," Proceeding 26th ESSCC, Sep. 2000, pp. 316-319.
A. Çağlar et al., "Design of Cryogenic LNAs for High Linearity in Space Applications", IEEE Transactions on Circuits and Systems, vol. 66, No. 12, Dec. 2019, pp. 1-9.
M. De Souza et al., "Reconfigurable Inductorless Wideband CMOS LNA for Wireless Communications", IEEE Trans. on Circuits and Systems, vol. 64, No. 3, Mar. 2017, pp. 675-685.
M. El-Nozahi et al., "An Inductor-Less Noise-Cancelling Broadband Low Noise Amplifier With Composite Transistor Pair in 90 nm CMOS Technology", IEEE J. of Solid-State Circuits, vol. 46, No. 5, May 2011, pp. 1111-1122.
G. Feng et al., "Pole-Converging Intrastage Bandwidth Extension Technique for Wideband Amplifiers", IEEE J. of Solid-State Circuits, vol. 52, No. 3, Mar. 2017, pp. 769-780.
A Geis et al., "A 0.5 mm Power-Scalable 0.5-3.8-GHz CMOS DT-SDR Receiver With Second-Order RF Band-Pass Sampler", IEEE J. of Solid-State Circuits, vol. 45, No. 11, Nov. 2010, pp. 2375-2387.
G. Guitton et al., "Design Methodology Based on the Inversion Coefficient and Its Application to Inductorless LNA Implementations", IEEE Transactions on Circuits and Systems, vol. 66, No. 10, Oct. 2019, pp. 3653-3663.

B. Guo et al, "A Wideband Noise-Canceling CMOS LNA With Enhanced Linearity by Using Complementary nMOS and oMOS Configurations", IEEE J. of Solid-State Circuits, vol. 52, No. 5, May 2017, pp. 1331-1344.
K.C. He et al., "Parallel-RC Feedback Low-Noise Amplifier for UWB Applications ", IEEE Transactions on Circuits and Systems, vol. 57, No. 8, Aug. 2010, pp. 582-586.
Y.C. Hsiao et al., "Analysis and Design of Broadband LC-Ladder FET LNAs Using Noise Match Network", IEEE Transaction on Microwave Theory and Techniques, vol. 66, No. 2, Feb. 2018, pp. 987-1001.
J.Y. Hsieh et al., "A 0.6-V Low-Power Variable-Gain LNA in 0.18-µm CMOS Technology", IEEE Transactions on Circuits and Systems, vol. 67, No. 1, Jan. 2020, pp. 23-26.
J. Hu et al., "A Seven-Octave Broadband LNA MMIC Using Bandwidth Extension Techniques and Improved Active Load", IEEE Transactions on Circuits and Systems, vol. 65, No. 10, Oct. 2018, pp. 3150-3161.
D. Im et al., "A High IIP2 Broadband CMOS Low-Noise Amplifier With a Dual-Loop Feedback",IEEE Transaction on Microwave Theory and Techniques, vol. 64, No. 7, Jul. 2016, pp. 2068-2079.
D. Im et al., "A Wideband CMOS Low Noise Amplifier Employing Noise and IM2 Distortion Cancellation for a Digital TV Tuner", IEEE J. of Solid-State Circuits, vol. 44, No. 3, Mar. 2009, pp. 686-698.
J. Jang et al., "Two-Stage Compact Wideband Flat Gain Low-Noise Amplifier Using High-Frequency Feedforward Active Inductor", IEEE Transaction on Microwave Theory and Techniques, 2019, pp. 1-9.
E. Kargaran et al., "Design and Analysis of 2.4 GHz 30 µW CMOS LNAs for Wearable WSN Applications", IEEE Transactions on Circuits and Systems, vol. 65, No. 3, Mar. 2018, pp. 891-903.
J. Kim et al., "Wideband Inductorless Balun-LNA Employing Feedback for Low-Power Low-Voltage Applications", IEEE Transaction on Microwave Theory and Techniques, vol. 60, No. 9, Sep. 2012, pp. 2833-2842.
S. Kim et al., "A 50-MHz-1-GHz 2.3-dB NF Noise-Cancelling Balun-LNA Employing a Modified Current-Bleeding Technique and Balanced Loads", IEEE Transactions on Circuits and Systems, vol. 66, No. 2, Feb. 2019, pp. 564-554.
A.R.A. Kumar et al., "A Wideband 2-5 GHz Noise Canceling Subthreshold Low Noise Amplifier", IEEE Transactions on Circuits and Systems, vol. 65, No. 7, Jul. 2018, pp. 834-838.
Z. Li et al., "Low-noise and high-gain wideband LNA with gm-boosting technique", Electronic Letters, vol. 49, No. 18, Aug. 29, 2013, pp. 1126-1128.
C.F. Liao et al., "A Broadband Noise-Canceling CMOS LNA for 3.1-10.6-GHz UWB Receivers", IEEE J. of Solid-State Circuits, vol. 42, No. 2, Feb. 2007, pp. 329-339.
Y.J. Lin et al., "A 3.1-10.6 GHz Ultra-Wideband CMOS Low Noise Amplifier With Current-Reused Technique", IEEE Microwave and Wireless Components Letters, vol. 17, No. 3, Mar. 2007, pp. 232-234.
S. Liu et al. "A Low-Power Low-Noise VCO with Nearly Constant KVCO for UHF RFID Transceivers", IEEE International Conference on Electron Devices and Solid State Circuit (EDSSC), 2012, pp. 1-2.
J.Y.C. Liu et all., "A Wideband Inductorless Single-to-Differential LNA in CMOS Technology for Digital TV Receivers", IEEE Microwave and Wireless Components Letters, vol. 24, No. 7, Jul. 2014, pp. 472-474.
L. Ma et al."A High-Linearity Wideband Common-Gate LNA With a Differential Active Inductor", IEEE Transactions on Circuits and Systems, vol. 64, No. 4, Apr. 2017, pp. 402-406.
D. Manstretta et al., "Second-Order Intermodulation Mechanisms in CMOS Downconverters", IEEE J. of Solid-State Circuits, vol. 38, No. 3, Mar. 2003, pp. 394-406.
M. Meghdadi et al., "A Highly Linear Dual-Gain CMOS Low-Noise Amplifier for X-Band", IEEE Transactions on Circuits and Systems, vol. 65, No. 11, Nov. 2018, pp. 1604-1908.

(56) References Cited

OTHER PUBLICATIONS

M.Moezzi et al., "Wideband LNA Using Active Inductor With Multiple Feed-Forward Noise Reduction Paths", IEEE Transaction on Microwave Theory and Techniques, vol. 60, No. 4, Apr. 2012, pp. 1069-1078.

D. Murphy et al., "A Blocker-Tolerant Wideband Noise-Cancelling Receiver with a 2dB Noise Figure", IEEE, ISSCC, Feb. 2012, pp. 74-76.

Z. Pan et al., "Wideband Inductorless Low-Power LNAs with Gm Enhancement and Noise-Cancellation", IEEE Transactions on Circuits and Systems, vol. 65, No. 1, Jan. 2018, pp. 26-38.

S.K. Pandey et al., "A 0.1dB NF, 2GHz Low Power CMOS Low Noise Amplifier", IEEE International Conference on Control, Automation, Robotics and Embedded Systems (CARE), 2013, pp. 1-4.

J.W. Park et al., "A Harmonic-Rejecting CMOS LNA for Broadband Radios", IEEE J. of Solid-State Circuits, vol. 48, No. 4, Apr. 2013, pp. 1072-1084.

M. Parvizi et al., "Short Channel Output Conductance Enhancement Through Forward Body Biasing to Realize a 0.5 V 250 μW 0.6-4.2 GHz Current-Reuse CMOS LNA", IEEE J. of Solid-State Circuits, vol. 51, No. 3, Mar. 2016, pp. 574-586.

D. Pepe et al., "Transformer-Based Input Integrated Matching in Cascode Amplifiers: Analytical Proofs", IEEE Transactions on Circuits and Systems, vol. 65, No. 5, May 2018, pp. 1495-1504.

P.I. Mak et al., "A 2xVdd-Enabled Mobile-TV RF Front-End With TV-GSM Interoperability in 1-V 90-nm CMOS", IEEE Transaction on Microwave Theory and Techniques, vol. 58, No. 7, Jul. 2010, pp. 1664-1676.

M. Rahman et al., "A 2.4-GHz, Sub-1-V, 2.8-dB NF, 475-μW Dual-Path Noise and Nonlinearity Cancelling LNA for Ultra-Low-Power Radios", IEEE J. of Solid-State Circuits, vol. 53, No. 5, May 2018, pp. 1423-1430.

B. Razavi, "Cognitive Radio Design Challenges and Techniques", IEEE J. of Solid-State Circuits, vol. 45, No. 8, Aug. 2010, pp. 1542-1553.

S.S Regulagadda et al., "A Packaged Noise-Canceling High-Gain Wideband Low Noise Amplifier", IEEE Transactions on Circuits and Systems, vol. 66, No. 1, Jan. 2019, pp. 11-15.

Z. Ru et al., "A 300-800 MHz Tunable Filter and Linearized LNA Applied in a Low-Noise Harmonic-Rejection RF-Sampling Receiver", IEEE J. of Solid-State Circuits, vol. 45, No. 5, May 2010, pp. 967-978.

P. Simitsakis et al., "Design of a Low Voltage-Low Power 3.1-10.6 GHz UWB RF Front-End in a CMOS 65 nm Technology", IEEE Transactions on Circuits and Systems, vol. 57, No. 11, Nov. 2010, pp. 833-837.

R. Singh et al., "A Reconfigurable Dual-Frequency Narrowband CMOS LNA Using Phase-Change RF Switches", IEEE Transaction on Microwave Theory and Techniques, vol. 65, No. 11, Nov. 2017, pp. 4689- 4702.

P. Sivonen et al., "Analysis and Optimization of Packaged Inductively Degenerated Common-Source Low-Noise Amplifiers With ESD Protection", IEEE Transaction on Microwave Theory and Techniques, vol. 53, No. 4, Apr. 2005, pp. 1304-1313.

B. Toole et al., "RF Circuit Implications of Moderate Inversion Enhanced Linear Region in MOSFETs", IEEE Transactions on Circuits and Systems, vol. 51, No. 2, Feb. 2004, pp. 319-328.

S.B.T Wang et al., "Design of a Sub-mW 960-MHz UWB CMOS LNA", IEEE J. of Solid-State Circuits, vol. 41, No. 11, Nov. 2006, pp. 2449-2456.

X. Wang et al., "0.6-3-GHz Wideband Receiver RF Front-End With a Feedforward Noise and Distortion Cancellation Resistive-Feedback LNA", IEEE Transaction on Microwave Theory and Techniques, vol. 60, No. 2, Feb. 2012, pp. 387-392.

R.M. Weng et al., "A Low-Power Full-Band Low-Noise Amplifier for Ultra-Wideband Receivers", IEEE Transaction on Microwave Theory and Techniques, vol. 58, No. 8, Aug. 2010, pp. 2077-2083.

L. Wu et al., "Design and Analysis of CMOS LNAs with Transformer Feedback for Wideband Input Matching and Noise Cancellation", IEEE Transactions on Circuits and Systems, vol. 64, No. 6, Jun. 2017, pp. 1626-1635.

Y.H Yu et al., "A Compact Wideband CMOS Low Noise Amplifier With Gain Flatness Enhancement", IEEE J. of Solid-State Circuits, vol. 45, No. 3, Mar. 2010, pp. 502-509.

H. Yu et al., "A 0.044-mm2 0.5-to-7-GHz Resistor-Plus-Source-Follower-Feedback Noise-Cancelling LNA Achieving a Flat NF of 3.3±0.45 dB", IEEE Transactions on Circuits and Systems, vol. 66, No. 1, Jan. 2019 , pp. 71-75.

F. Zhang et al., "Low-Power Programmable Gain CMOS Distributed LNA", IEEE J. of Solid-State Circuits, vol. 41, No. 6, Jun. 2006, pp. 1333-1343.

H. Zhang et al., "Linearization Techniques for CMOS Low Noise Amplifiers: A Tutorial", IEEE Transactions on Circuits and Systems, vol. 58, No. 1, Jan. 2011, pp. 22-36.

H. Zhang et al., "A Low-Power, Linearized, Ultra-Wideband LNA Design Technique", IEEE J. of Solid-State Circuits, vol. 44, No. 2, Feb. 2009, pp. 320-330.

* cited by examiner

ULTRAWIDEBAND VERY LOW NOISE AMPLIFIER WITH NOISE REDUCTION AND CURRENT REUSE

REFERENCE TO PRIORITY APPLICATION

This application claims priority to U.S. Provisional Application Ser. No. 62/613,470, filed Jan. 4, 2018, entitled "Ultrawideband Very Low Noise Amplifier With Noise Reduction And Current Reuse," incorporated herein by reference in its entirety.

FIELD OF THE INVENTION

The present invention relates to the field of semiconductor integrated circuits and more particularly relates to an ultrawideband very low noise amplifier with noise reduction and current reuse.

BACKGROUND OF THE INVENTION

Currently, the use of wireless standards such as Wi-Fi, GPS, and Bluetooth is growing at an ever increasing rate. In order to use frequency bandwidth efficiently and to cover more communication standards with lower power consumption and reduced cost, multimode transceivers, software defined radios (SDRs) and recently cognitive radios have been considered by industry and academic researchers. The broadband behavior of a wireless receiver is defined by the front-end low noise amplifier (LNA) which is controlled by the tradeoff between input matching, noise figure (NF), gain, bandwidth, linearity, and voltage headroom. There are several techniques to design a wideband LNA including filter type amplifiers, $g_m$ enhancement techniques, common gate (CG) amplifiers, resistive shunt feedback amplifiers, and distributed amplifiers.

A very wide bandwidth (e.g., 3.1 GHz to 10.6 GHz) required for UWB applications can be achieved by the common source (CS) amplifier with a bandpass filter. Since, in this structure, the common source transistor is used, it exhibits good noise performance toward the common gate (CG) structure. The low-quality factor of on chip inductors, however, causes the noise figure to deteriorate. In addition, this technique is usually used for 3.1-10.6 GHz UWB applications where the gain and input matching at low frequencies is not required. The technique is not appropriate for cognitive radio applications below 3 GHz due to the large number of the required inductors.

Moreover, the bandpass filter occupies a relatively large area. Distributed amplifiers satisfy the required bandwidth for SDRs and optical communications. Nevertheless, this structure needs several stages to provide the highest bandwidth with a remarkable gain resulting in high power consumption and chip area. Also, this structure features high NF due to the noise from the gate line termination resistors and losses in the inductors.

A schematic diagram illustrating an example prior art common gate wideband matching technique is shown in FIG. 1A. A schematic diagram illustrating an example prior art shunt feedback common source wideband matching technique is shown in FIG. 1B. The common gate (CG) circuit, generally referenced 10, and the common source (CS) circuit, generally referenced 20, are two circuits commonly used to design wideband LNAs. For wideband input matching in the CS stage, the resistive feedback should be used but it is limited by the input capacitance, and hence, it is difficult to achieve very broad bandwidth. The CG stage can provide broadband input impedance matching without extra components. Since the parasitic gate-drain capacitor is AC grounded, it has a better input-output isolation than the CS amplifier with negative feedback. The linearity of the CG structure is better than the CS amplifier, because in the CG scheme, the input source resistance provides the source degeneration as well.

The noise factor of the common-gate structure shown FIG. 1A is given by $F=1+(\gamma/+g_{m1}R_S)+(4/g_{m1}R_D)$ and its input impedance is approximately $1/(g_{mb1}+g_{m1})$ where $\gamma$ is the excess noise factor in short channel devices and $\alpha$ is the ratio of the transconductance $g_m$ of the zero-bias drain conductance $g_{d0}$, i.e. $\alpha=g_m/g_{d0}$. In these expressions, $g_m$ denotes the transistor's small-signal transconductance and $g_{mb}$ models the transistor's body effect. Thus, this structure suffers from the poor noise performance because the total $g_m$ of this structure should be 20 mA/V to provide the input matching condition. There is not, however, such a limitation in the CS structure. A popular method to enhance the noise performance of a CG amplifier is the noise cancellation technique which removes the channel thermal noise of the main transistor.

Note that although conventional common-gate (CG) low noise amplifiers are used to provide wide bandwidth, they suffer from poor noise performance. Thus, noise cancellation techniques are used to improve their noise performance by cancelling the thermal current noise of the input stage. The thermal current noise of the noise cancelling stage, however, is the dominant noise source in the CG LNA.

To improve the noise performance of the CG LNA incorporating the noise cancellation technique, prior art methods either increase the dc power of the noise cancellation stage or use an additional noise cancellation block to cancel the thermal current noise of the first noise cancellation stage.

Increasing the power of the second stage, however, is not effective in low power systems as the dc power cannot be increased ad infinitum since noise cancellation criteria needs to be provided for the input stage. The main drawback of using the second noise cancellation stage is the need for an extra circuit stage that requires additional power consumption, area and cost.

There is thus a need for a circuit that improves the noise performance of the CG LNA with noise cancellation technique that does not require an extra second stage circuitry with consequent increased power consumption, area, and cost.

SUMMARY OF THE INVENTION

A novel noise reduction technique is provided that improves the noise figure (NF) of a common-source (CS) low noise amplifier (LNA) or low noise transconductance amplifier (LNTA). The technique exploits current reuse and increases transconductance of the CS transistor while maintaining its power consumption. The ultrawideband (UWB) LNA operating in the 0.1-7.3 GHz band is applicable to 4G/5G receivers. It exploits the combination of a common-gate (CG) stage for wideband input matching and a CS stage for canceling the noise and distortion of the CG stage. In addition, the noise reduction technique is applied to reduce the channel thermal noise of the noise cancellation stage.

By using noise reduction and current reuse techniques, the thermal current noise of the noise cancellation stage is reduced without adding any extra branch to the circuit. As a result, the thermal current noise of the second stage decreases dramatically leading to better NF without consuming any extra power. Moreover, since the circuit block is implemented using a pMOS transistor, the second order nonlinearity of pMOS and nMOS transistors cancel each other, resulting in improved nonlinearity performance of the LNA, including improvements to both IIP2 and IIP3.

Applying the noise reduction and the current reuse techniques to reduce the current thermal noise of the cancellation stage improves the NF of the LNA without consuming any extra power.

Moreover, since the LNA of the present invention covers a very wide bandwidth and has a very low NF and good linearity, it is suitable for use in a variety of applications including IOT and especially 4G and 5G receivers which require high sensitivity.

The noise cancellation circuit of the present invention achieves a lower noise figure (NF) without increasing power consumption using a current reuse technique. In addition, a low power LNA is provided that uses the CG structure to provide wideband input matching. The noise cancellation technique of the present invention is used to cancel the channel thermal noise of the CG transistor and also to partially remove the circuit's nonlinear distortion. By using the noise reduction technique, the channel thermal noise of the cancellation stage is reduced. Moreover, the technique is used to improve the linearity of the CG transistor and the pMOS-nMOS structure is applied to enhance the linearity of the CS transistor.

In one embodiment, the noise reduction and current reuse techniques of the present invention significantly decrease the thermal current noise of the second stage (i.e. noise cancelling stage). Consequently, this improves the noise figure of the LNA by 3 dB without adding any power consumption.

There is thus provided in accordance with the invention, a low noise amplifier (LNA) circuit, comprising an input node for receiving an input signal, an input matching stage coupled to said input node and operative to provide wideband input matching, a noise cancellation stage coupled to the input matching stage and operative to substantially cancel thermal current noise generated by the input matching stage, and a noise reduction stage coupled to the input matching stage and the noise cancellation stage, the noise reduction stage operative to reduce thermal current noise of the noise cancellation stage and to generate an output signal thereby.

There is also provided in accordance with the invention, a noise reduction method for use in a low noise amplifier (LNA), the method comprising receiving an input signal at an input node, wideband matching the input signal utilizing an input matching stage, canceling thermal noise generated by the input matching stage utilizing a noise cancellation stage, and reducing thermal noise generated by said the cancellation stage utilizing a noise reduction stage to generate an output signal thereby.

There is further provided in accordance with the invention, a low noise amplifier (LNA) circuit, comprising an input node for receiving an input signal, an input matching stage coupled to the input node and operative to provide wideband input matching, a first noise cancellation stage coupled to the input matching stage and operative to substantially cancel thermal current noise generated by the input matching stage, and a second noise cancellation stage coupled to the first noise cancellation stage and operative to substantially cancel thermal current noise generated by the first noise cancellation stage and to generate an output signal thereby.

BRIEF DESCRIPTION OF THE DRAWINGS

The invention is herein described, by way of example only, with reference to the accompanying drawings, wherein.

DETAILED DESCRIPTION OF THE INVENTION

To aid in understanding the operation of the noise reduction technique of the present invention, the basic idea of conventional noise cancellation is presented. Then, the noise reduction technique of the present invention is described.

Regarding conventional noise cancellation techniques, the most important noise source in CMOS transistors at radio frequencies is the channel thermal noise. This noise is modeled as a shunt current source between the transistor drain and source terminals. The goal of the designer is to minimize the amount of noise generated within each element to obtain a low NF.

Figure 2:
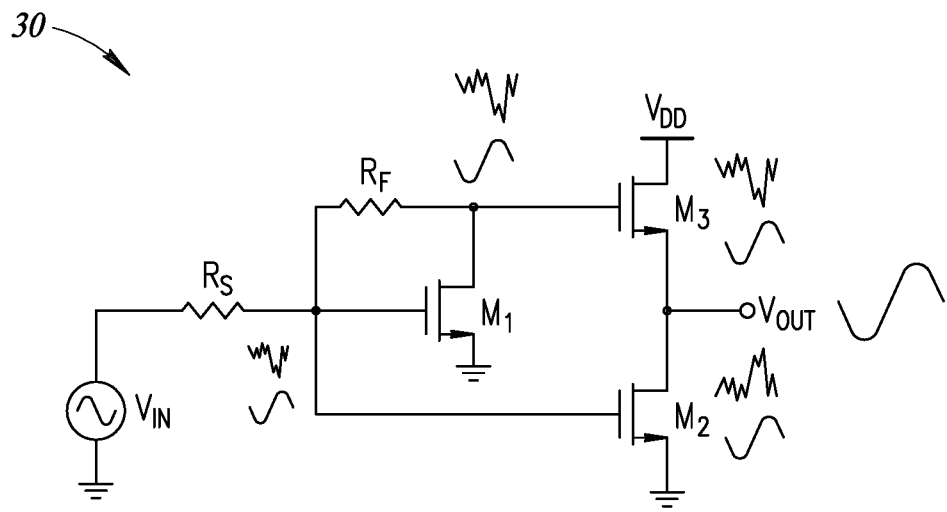
FIG. 2 is a schematic diagram illustrating an example conventional noise cancellation technique.

An example conventional noise cancellation scheme is shown in FIG. 2. In operation, the noise current of the main transistor $M_1$ flows through the feedback resistor $R_F$ to the gate of the matching amplifier and creates two noise voltages with the same phase but different amplitudes in nodes X and Y. On the other hand, the signal voltage at these nodes has opposite phase and different amplitude due to the inverting amplifier. The difference of signal and noise polarities at nodes X and Y results in cancellation of the noise of the matching transistor while adding the signal contributions constructively. The noise voltage in node X, $V_{nX}$, is amplified and inverted by $M_2$ while the noise voltage in node Y, $V_{nY}$, passes across $M_3$ without any change. Then in the output, the two voltages with opposite phases are summed. Therefore, the channel thermal noise of $M_1$ is canceled at the output provided that the following condition is satisfied:

$$V_{n,out} = V_{nY} \frac{r_{ds2}}{r_{ds2} + 1/g_{m2}} - v_{nX} \frac{g_{m2}}{g_{m3}} = 0 \quad (1)$$

$$\frac{R_F + R_s}{R_s} = \frac{g_{m2}}{g_{m3}}$$

where $g_m r_{ds} \gg 1$ is assumed.

As mentioned supra, this kind of noise cancellation is well known and used in numerous LNA structures. The main drawback of this technique, however, is the need for an extra stage in order to amplify and invert the noise voltage in node X and add it to $V_{nY}$ at the output. According to Equation 1, since the size of the feedback resistor is much larger than the size of the source resistor, $R_F \gg R_s$, the transconductance of $M_2$, $g_{m2}$, must be large enough to provide the noise cancellation condition. As a result, power consumption is increased. To address this, the present invention provides a noise reduction technique which improves the NF without increasing the power consumption.

Figure 3:
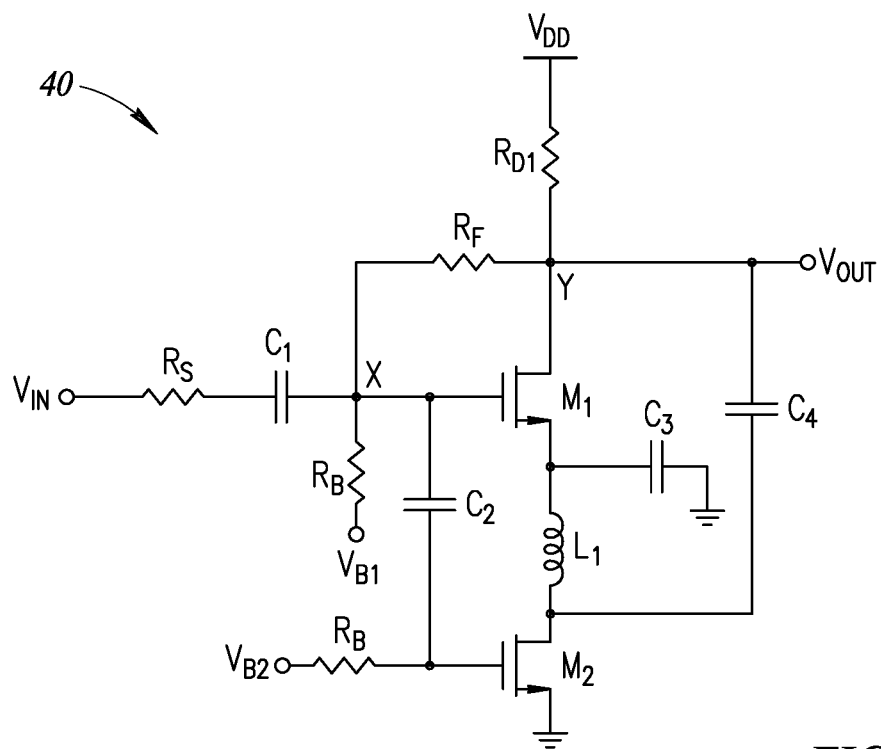
FIG. 3 is a schematic diagram illustrating an example noise reduction technique.

The main goal of the noise reduction technique of the present invention is to improve the noise performance of the common-source structure without consuming any extra power. This is achieved by using a direct current (dc) current reuse technique. An example noise reduction technique is shown in FIG. 3. In this circuit, generally referenced 40, the noise voltage at node X, $V_{nX}$, is amplified, inverted, and added to the noise voltage in node Y, $V_{nY}$. In this manner, the adder is not used because the amplified $V_{nX}$ is sent to the output where the noise voltage $V_{nY}$ exists. Thus, any extra branch is not used in this technique. This technique can be considered to perform different functions: (1) to reduce the NF or (2) to reduce the power consumption. In the former, the noise figure is improved by the constant power consumption and in the latter the noise figure is considered constant enabling a reduction in power consumption.

Figure 1A:
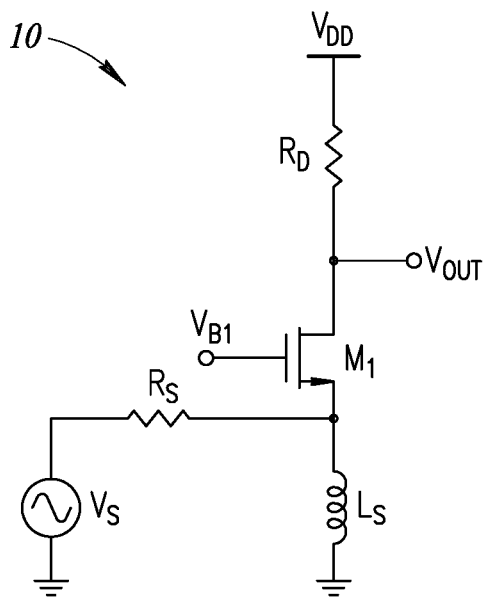
FIG. 1A is a schematic diagram illustrating an example prior art common gate wideband matching technique.
Figure 1B:
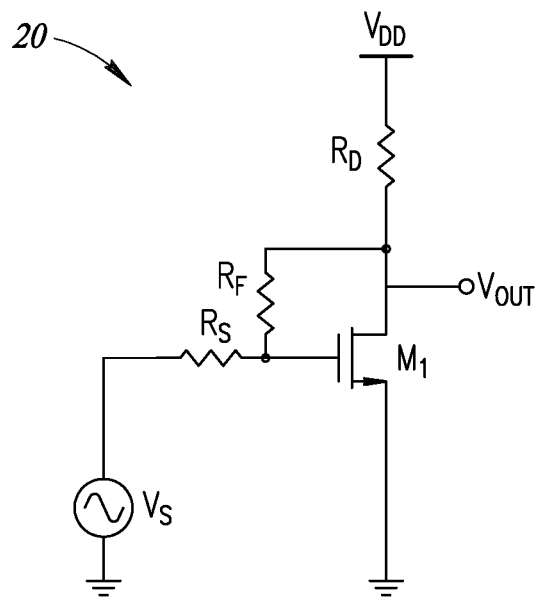
FIG. 1B is a schematic diagram illustrating an example prior art shunt feedback common source wideband matching technique.

These two cases are explained as follows. With reference to FIG. 3, $M_1$ is the main transistor whose thermal noise should be reduced. $M_2$ acts as a gain-inverter in order to amplify Via at the output. The gate of these transistors is connected together through $C_2$. In addition, the source of $M_1$ is connected to the ground by $C_3$. The inductor $L_1$ isolates the drain and source of two transistors. Thus, in dc mode, $M_2$ is biased by the main transistor current. In ac mode, however, $M_2$ is paralleled with the main transistor. As mentioned supra, the main noise source in the shunt-feedback amplifier shown in FIG. 1B is the channel thermal noise of $M_1$ which is calculated as:

$$F_{M1} = \left| \frac{\overline{V_{n,M1}}/A_v}{V_{n,Rs}} \right|^2 = \left| \frac{\overline{I_{n,M1}} Z_{out}}{V_{n,Rs} A_v} \right|^2 \quad (2)$$

$$= \frac{4kTg_{m1}|Z_{out}|^2}{4kTg_{m1}^2|Z_{out}|^2} \frac{\gamma}{\alpha} = \frac{1}{R_s g_{m1}} \frac{\gamma}{\alpha}.$$

where $F_{M1}$ is the noise factor due to the channel thermal noise in $M_1$ and $Z_{out}$ is the output impedance. In addition, $\overline{I_{n,M_1}}^2 = 4kTg_{m1}$ is the channel thermal noise of $M_1$ and $A_v = g_{m1} Z_{out}$. Hence, the noise factor of the shunt-feedback amplifier shown in FIG. 1B is approximately equal to:

$$F \geq 1 + \frac{1}{g_{m1} R_s} \frac{\gamma}{\alpha} \quad (3)$$

According to Equation 3, the noise factor has a reverse relation with the transconductance. It means that by increasing the transconductance of the main transistor, the circuit's noise figure is decreased. But, this results in more power dissipation. By using the noise reduction technique, the noise factor is roughly equal to: $F_1 + F_{M1} + F_{M2}$ where $F_{M1}$ and $F_{M2}$ are expressed by:

$$F_{M1} = \frac{4kTg_{m1}|Z_{out}|^2}{4kTR_s(g_{m1} + g_{m2})^2 |Z_{out}|^2} \frac{\gamma}{\alpha} \quad (4)$$

$$= \frac{g_{m1}}{R_s(g_{m1} + g_{m2})^2} \frac{\gamma}{\alpha}.$$

$$F_{M2} = \frac{4kTg_{m2}|Z_{out}|^2}{4kTR_s(g_{m1} + g_{m2})^2 |Z_{out}|^2} \frac{\gamma}{\alpha} \quad (5)$$

$$= \frac{g_{m2}}{R_s(g_{m1} + g_{m2})^2} \frac{\gamma}{\alpha}.$$

Finally, the total noise factor of the circuit, without considering the thermal noise of $R_{D1}$, is approximately given by:

$$F \geq 1 + \frac{\gamma}{\alpha(g_{m1} + g_{m2})R_s} \quad (6)$$

According to Equation 6, by using the noise reduction technique, $M_2$ is paralleled with the main transistor (i.e. in the small signal or ac model; in the dc mode the two transistors are stacked for current reuse), and hence, its transconductance is added with $g_{m1}$. As a result, the transconductance of the main transistor is enhanced. This technique reduces the noise figure without increasing the bias current. If the dc current reuse technique is not used and $M_2$ is paralleled with $M_1$, the structure consumes two times more power in order to achieve the same NF. Nonetheless, the main drawback of this technique is the reduced voltage headroom.

Figure 4:
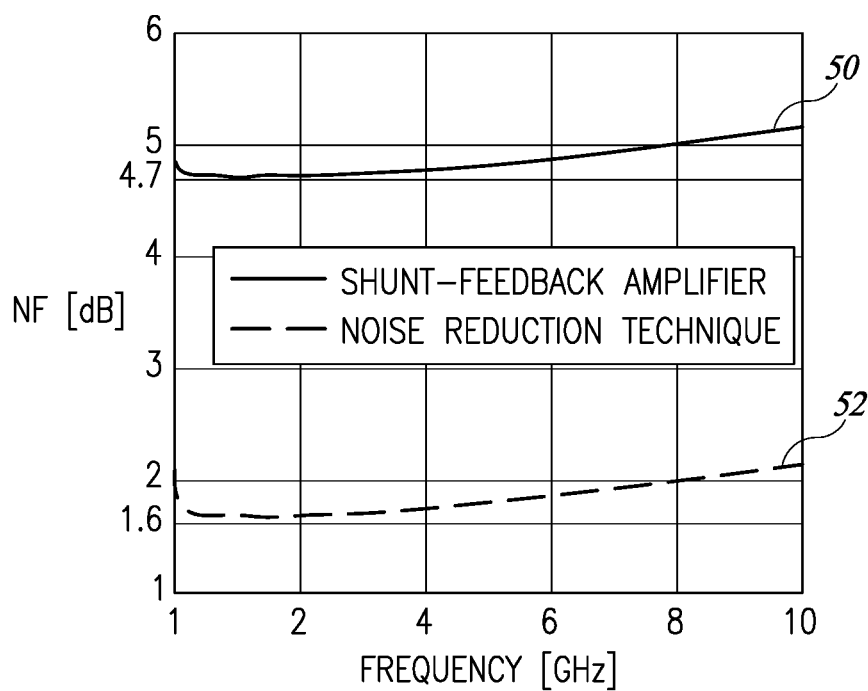
FIG. 4 is a graph illustrating a comparison of noise figure (NF) of a shunt feedback common source amplifier with and without the noise reduction technique.

The LNA shown in FIG. 3 has been designed and constructed in 28 nm CMOS technology. The performance of the noise reduction technique is illustrated in FIG. 4 as trace 52 and is compared with trace 50 from the shunt feedback amplifier shown in FIG. 1B. In this comparison, it has been considered that both structures consume the same power, and also, the size of $M_1$ in both structures is the same. As shown in FIG. 4, the structure of the present invention significantly reduces the noise figure. The noise figure variation of the shunt feedback amplifier is between 4.7 to 5.2 dB. By using the noise reduction technique of the present invention, the NF is reduced and it is between 1.6 to 2.1 dB. The power consumption of the circuit of FIG. 3 is the same as the main structure without the noise reduction of FIG. 1B. According to Equation 1, in the conventional noise cancellation, the current of the second stage should be increased in order to satisfy the noise cancellation condition resulting in more power dissipation.

Figure 5:
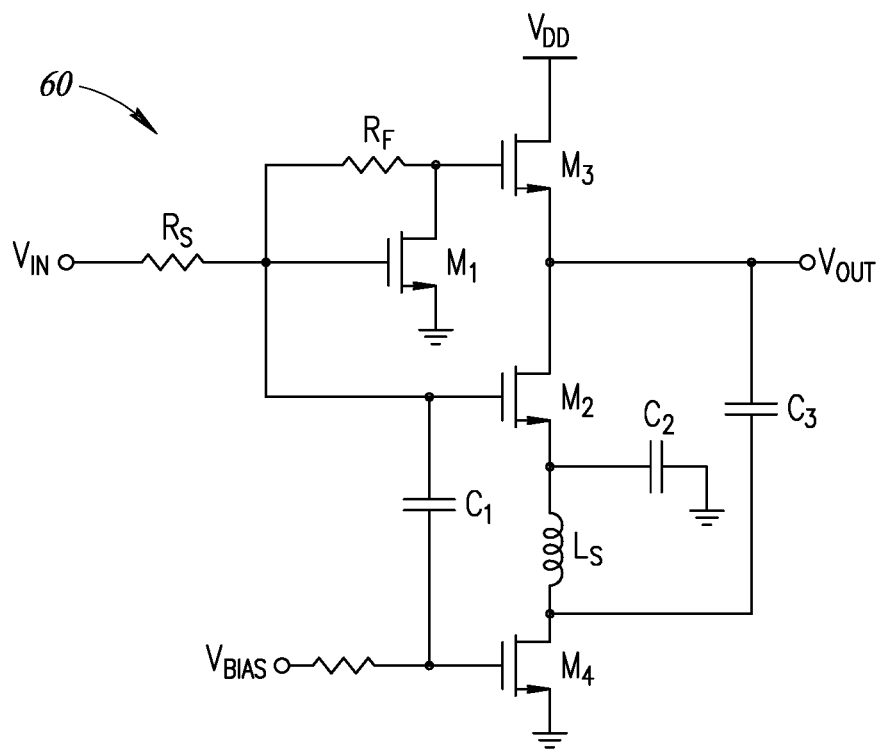
FIG. 5 is a schematic diagram illustrating an example noise cancellation and reduction technique.

A schematic diagram illustrating an example noise cancellation and reduction technique is shown in FIG. 5. As shown in the circuit, generally referenced 60, when the noise reduction technique is used in the conventional noise cancellation, the transconductance of $M_2$ is increased without any extra power. As a result, the noise cancellation condition is provided while consuming less power. This is given by:

$$\overline{V}_{n,out}^2 = \overline{V}_{nY}^2 \left( \frac{r_{ds2} \| r_{ds4}}{r_{ds2} \| r_{ds4} + 1/g_{m3}} \right)^2 - \overline{V}_{nX}^2 \left( \frac{g_{m2} + g_{m4}}{g_{m3}} \right)^2 \quad (7)$$

$$V_{n,out} = 0 \Rightarrow \frac{R_F + R_s}{R_s} = \frac{g_{m2} + g_{m4}}{g_{m3}}$$

In the above, $g_{m2}$ is added with $g_{m4}$ and hence this condition can be satisfied by consuming less power. Therefore, using the noise reduction approach in the noise cancellation stage of the conventional noise cancellation scheme reduces the power dissipation without affecting the NF. Note that Equation 7 is used to show the effect of $M_4$ in the conventional noise cancellation condition without considering the parasitic capacitances. The noise cancellation condition of the circuit, considering all parasitic capacitances, is shown in Equation 10. Although in practice, the condition presented in Equation 8 is not completely satisfied due to the parasitic capacitances and the limitation of the power consumption. Therefore, the noise is reasonably attenuated even by partially meeting this condition.

Figure 6:
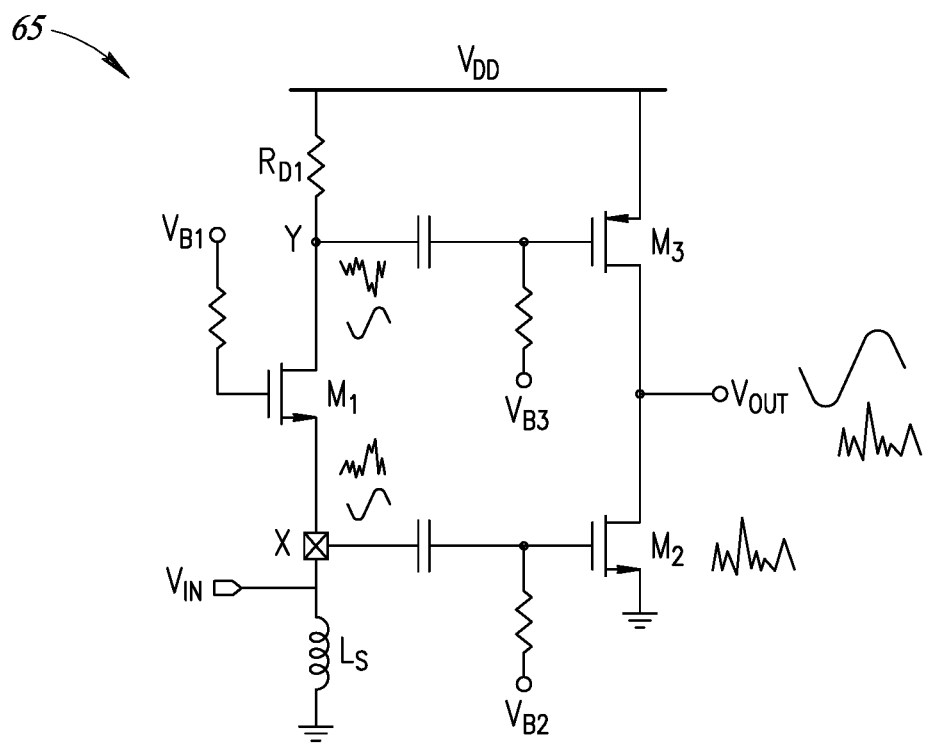
FIG. 6 is a schematic diagram illustrating an example wideband noise cancelling low noise amplifier (LNA)

A schematic diagram illustrating an example wideband noise cancelling low noise amplifier (LNA) is shown in FIG. 6. In the circuit, generally referenced 65, the common gate (CG) transistors are used as an input stage to provide wideband input matching. The channel thermal noise of the matching transistor creates two out of phase voltage noises at nodes Y and X, with the latter smaller in amplitude. By amplifying the voltage noise X through $M_2$ and adding it to the voltage noise Y amplified through $M_3$, the noise of the input transistor $M_1$ is canceled at the output. Although in this NC structure the channel thermal noise of the matching stage $M_1$ is cancelled by the second stage, i.e. $M_2$ and $M_3$, the noise of the second stage is unaffected and can negatively impact the overall noise performance. This is reinforced by the fact that the input matching stage does not provide enough gain, so $M_2$ can be the dominant noise source.

Figure 7:
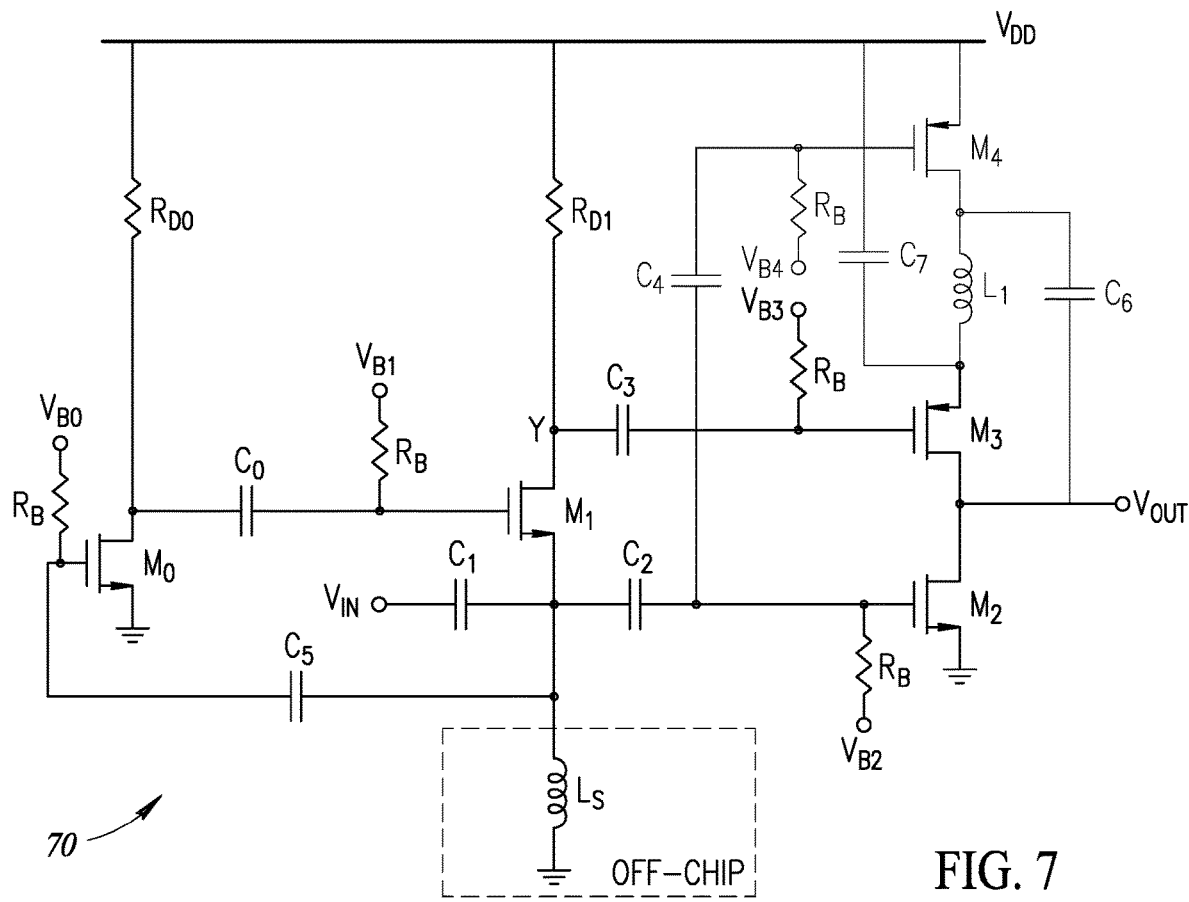
FIG. 7 is a schematic diagram illustrating an example wideband noise cancelling low noise amplifier (LNA) incorporating noise cancellation and reduction techniques.

A schematic diagram illustrating an example wideband noise cancelling low noise amplifier (LNA) incorporating noise cancellation and reduction techniques is shown in FIG. 7. The LNA, generally referenced 70, is applicable to 4G/5G applications. In this topology, $M_1$ provides the wideband input matching. Moreover, the CS stage $M_2$, is selected to cancel the channel thermal noise of $M_1$. To reuse the current of $M_2$ and improve the IIP2, $M_3$ is chosen as a pMOS transistor. The inductor $L_S$ functions to provide a dc current path and resonates with the total parasitic capacitance at the input node. Finally, the presented noise reduction is used in the LNA. By using the current-reuse technique, the transistor $M_4$ is paralleled with $M_2$ ac-wise in order to boost its transconductance, and hence, decrease its thermal noise effect. In the LNA, the pMOS-nMOS structure and sweet spot biasing are applied to improve the linearity. Moreover, in one embodiment, a large value is selected for inductor $L_S$ and located off-chip in order to save on-chip area.

Note that the common-gate transistor is used in the first stage to realize the wideband input matching. To consider the body effect of $M_1$ and also to simplify the relations, $G_{m1}$ stands for $(1+g_{m0})(g_{m1}+g_{mb1}) \sim (1+g_{m0})g_{m1}$. Hence, the input impedance is given by:

$$Z_{in} = (R_{Ls} + sL_s) \left\| \frac{1}{sC_X} \right\| \frac{1}{G_{m1}} \quad (8)$$

$$= \frac{R_{Ls} + sL_s}{C_X L_s s^2 + (R_{Ls} C_X + G_{m1} L_s)s + (G_{m1} R_{Ls} + 1)}$$

where $C_X$ demonstrates the total parasitic capacitance in node X which is damped by $L_S$. The size of $L_S$ should be increased up to 150 nH to achieve the input matching at low frequencies. If the size of $L_S$ is decreased, the series resistance of $L_S$, $R_{Ls}$, will be also decreased (approximately up to 5) due to the limited quality factor of $L_S$. This resistance is paralleled with $1/(G_{m1})$ and lowers the equivalent input impedance.

The equivalent impedance, seen from the drain of $M_1$ toward the ground, is called $Z_Y$ and it is equal to $R_{D1} \| r_{ds1} + (R_s \| 1/sC_X \| sL_s)(1+G_{m1}r_{ds1}) \| sC_y$ where $R_S$ is the source resistance. Moreover, $R_{D1}$ is the load resistance of $M_1$ and $C_Y$ is the total parasitic capacitance in node Y. $Z_{out}$ determines the output impedance which is calculated as $r_{ds2} \| r_{ds3} \| r_{ds4} 1/sC_{out}$ where $C_{out}$ is the total output parasitic capacitance. Therefore, the voltage gain of the proposed LNA is given by:

$$A_v = \frac{1/g_{m1}}{1/g_{m1} + R_s} (g_{m1} g_{m3} |Z_Y| + g_{m2} + g_{m4}) |Z_{out}| \quad (9)$$

Technology scaling causes the value of $r_{ds}$ to be reduced due to the channel length reduction. Also, by using pMOS transistors at the output node, the parasitic capacitances are increased resulting in more variation in $r_{ds}$ at high frequencies. This is the main reason the bandwidth of the circuit is limited at high frequencies. To solve this problem, inductive shunt-peaking and series-peaking techniques can be used. The shunt inductive peaking causes a resonance at the output of each stage when the gain starts to roll off at higher frequencies.

As mentioned supra, the purpose of noise cancellation is to dissociate the input matching relation from the NF by canceling the noise from the matching stage at the output node. In the LNA of the present invention, the current noise of the input transistor flows into node X but out of node Y causing two voltages with opposite phases at these nodes. These two voltages are converted to current by $M_2$ and $M_3$. But, the input signal in these two nodes have the same phase. Thus, the input signal is amplified at the output. These two noise voltages are calculated as $V_{nX}^2 = Z_{in}^2 I_{n,M1}^2$. Thus, the output current noise due to the thermal noise of $M_1$ is as follows:

$$\overline{I_{n,out}}^2 = \overline{V_{nX}}^2 (g_{m2} + g_{m4})^2 - \overline{V_{nX}}^2 g_{m3} = 0 \quad (10)$$

$$= \frac{g_{m2} + g_{m4}}{g_{m3}} = \frac{Z_Y}{Z_X}$$

In one embodiment, to reuse the current of $M_2$, $M_3$ is chosen as a pMOS transistor. Also, the noise reduction technique is applied to improve the NF without any additional power consumption. In this technique, for ac signals, $M_4$ is paralleled with $M_2$, and hence, the transconductance of $M_4$ is added to that of $M_2$. Moreover, $M_4$ is selected as a pMOS transistor in order to reuse the current of $M_2$. By increasing the transconductance of $M_2$, the channel thermal noise of the cancellation stage is reduced. In this way, any extra branch is not used in the LNA. Thus, the improvement in noise figure is achieved without consuming any extra power as explained supra. By using the noise cancellation technique, the most important noise sources are the thermal noise of $R_{D1}$ and the channel thermal noise of transistors $M_2$, $M_3$, and $M_4$. The noise factor of the LNA is equal to $F=1+F_{RD1}+F_{M2}+F_{M3}+F_{M4}$ where the terms are given by the following relations:

$$F_{R,D1} = \frac{4kTR_{D1}(g_{m3}|Z_{out}|)^2(Z_{o1}/(Z_{o1}+R_{D1}))^2}{4kTR_s A_v^2} \quad (11)$$
$$\cong \frac{R_s}{R_{D1}}$$

where according to FIG. 7, $Z_{o1}=[r_{ds1}+(R_s\|1/sC_X\|sL_s)(1+g_{m1}r_{ds1})]$ and $Z_Y=R_{D1}\|Z_{o1}$ when the parasitic capacitances in node Y are not considered in order to simplify the above equation. $A_v$ denotes the voltage gain of proposed LNA which is simplified by considering the noise cancellation condition $(g_{m2}+g_{m4})R_s=g_{m3}R_{D1}$ and input matching as $Z_{in}=R_s=1/G_{m1}$.

$$F_{M2} = \frac{4kTg_{m2}|Z_{out}|^2}{4kTR_s A_v} \frac{\gamma}{\alpha} = \quad (12)$$
$$\frac{4g_{m2}}{R_s(Z_Y G_{m1}g_{m3}+g_{m2}+g_{m4})^2} \frac{\gamma}{\alpha} \cong \frac{g_{m2}}{R_s(g_{m2}+g_{m4})^2} \frac{\gamma}{\alpha}.$$

$$F_{M3} = \quad (13)$$
$$\frac{4kTg_{m3}|Z_{out}|^2}{4kTR_s A_v} \frac{\gamma}{\alpha} = \frac{4g_{m3}}{R_s(Z_Y G_{m1}g_{m3}+g_{m2}+g_{m4})^2} \frac{\gamma}{\alpha} \cong \frac{R_s}{|Z_Y|^2 g_{m3}} \frac{\gamma}{\alpha}.$$

$$F_{M4} = \frac{4kTg_{m4}|Z_{out}|^2}{4kTR_s A_v} \frac{\gamma}{\alpha} = \quad (14)$$
$$\frac{4g_{m4}}{R_s(Z_Y G_{m1}g_{m3}+g_{m2}+g_{m4})^2} \frac{\gamma}{\alpha} \cong \frac{g_{m4}}{R_s(g_{m2}+g_{m4})^2} \frac{\gamma}{\alpha}.$$

Considering the noise cancellation condition, Equation 13 can be simplified as follows:

$$F_{M3} = \frac{\gamma R_s}{\alpha |Z_Y|^2 g_{m3}} \cong \frac{\gamma R_s}{R_{D1}(g_{m2}+g_{m4})R_s \alpha} \cong \frac{\gamma}{\alpha R_{D1}(g_{m2}+g_{m4})}. \quad (15)$$

Finally, the total noise factor of the LNA of the present invention is approximately given by:

$$F \cong 1 + \frac{R_s}{R_{D1}} + \frac{\gamma}{\alpha R_{D1}(g_{m2}+g_{m4})} + \frac{\gamma}{\alpha R_s(g_{m2}+g_{m4})} \quad (16)$$

where the fourth component in Equation 16 represents the total noise factor due to $M_2$ and $M_4$ transistors. According to Equation 16, to reduce the thermal noise of $R_{D1}$, its value should be increased, but, this is limited by the voltage drop on $R_{D1}$. In addition, the channel thermal noise of $M_3$ can be decreased by enhancing $g_{m2}$. Referring to FIG. 7, by using the noise reduction technique of the present invention, $g_{m2}$ is increased without utilizing any additional power.

Figure 8:
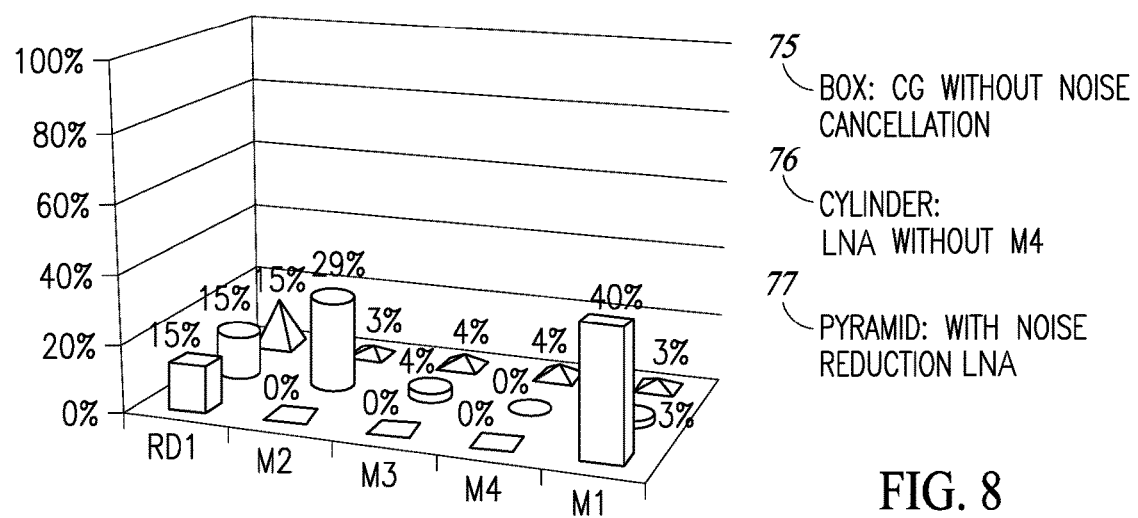
FIG. 8 is a diagram illustrating the percentage of noise sources for common gate structure, LNA without noise reduction, and LNA with noise reduction.

The LNA 70 shown in FIG. 7 has been designed and constructed using 28 nm CMOS technology. The percentage of noise sources in the total NF at 800 MHz is shown in FIG. 8 where the circuit of the present invention structure (pyramids 77) is compared with two others, namely (1) the CG structure shown in FIG. 1A without any noise cancellation and reduction techniques (boxes 75) and (2) an LNA without $M_4$, i.e. without the noise reduction technique of the present invention (cylinders 76), i.e. the circuit of FIG. 6. In this comparison, the LNA with and without $M_4$ consumes 6.5 mW power with the same size transistors. The size of transistor in the CG structure is the same as the size of CG transistor in the LNA of the present invention and its power consumption is the same as that of the first stage in the circuit of the present invention which is about 1.5 mW.

As shown, the common-gate structure (boxes 75) suffer from high NF. The channel thermal noise of the main transistor $M_1$ is 40% of the total NF. By canceling the thermal noise of the main transistor, the most effective noise source, which is controllable, is the thermal noise of $M_2$. In the structure without $M_4$ (cylinders 76) the thermal noise of the main transistor $M_1$ is reduced to 3%, whereas the thermal noise of the cancellation transistor $M_2$ is added to the circuit and its amount is almost 29%. By using both noise reduction and cancellation techniques (pyramid 77) the thermal noise of $M_2$ is decreased to 3%, and hence, the noise performance is improved while using the same power consumption. The thermal noise of $R_{D1}$ remains after using the cancellation and reduction techniques. To reduce the noise effect of $R_{D1}$, its amount should be increased, but as mentioned supra, the amount of $R_{D1}$ is limited by the supply voltage.

In a wireless communication receiver, signals are usually treated as small signals before the baseband amplifier. The important nonlinearity effects for small signals are the second and third order intermodulation products, of which the former is preferably lowered in a direct-conversion receiver, while the latter should be suppressed enough to avoid the large interference from adjacent channels.

Since the nonlinearity of a CS transistor is worse than that of a CG transistor, the pMOS-nMOS structure is applied in the output stage to enhance the values of IIP2 and IIP3. According to the circuit 70 of FIG. 7, utilizing power series, the current of either pMOS or nMOS transistor is equal to $i_{ds}=g_m(v_{in}-v_s)+g'_m(v_{in}-v_s)^2+g''_m(v_{in}-v_s)^3$ where $g_m$, $g'_m$, and $g''_m$ are the first three order derivatives of the drain-source dc current $i_{ds}$ with respect to $v_{gs}$ which are the linear, second-order and third-order nonlinear components, respectively. By considering this equation in the second stage of the proposed LNA, the second-order nonlinear term $2g'_m v_{in} v_s$ can be mixed with the input by the feedback path. Thus, the third-order nonlinear component is generated and added to the main third-order nonlinear term.

Figure 9:
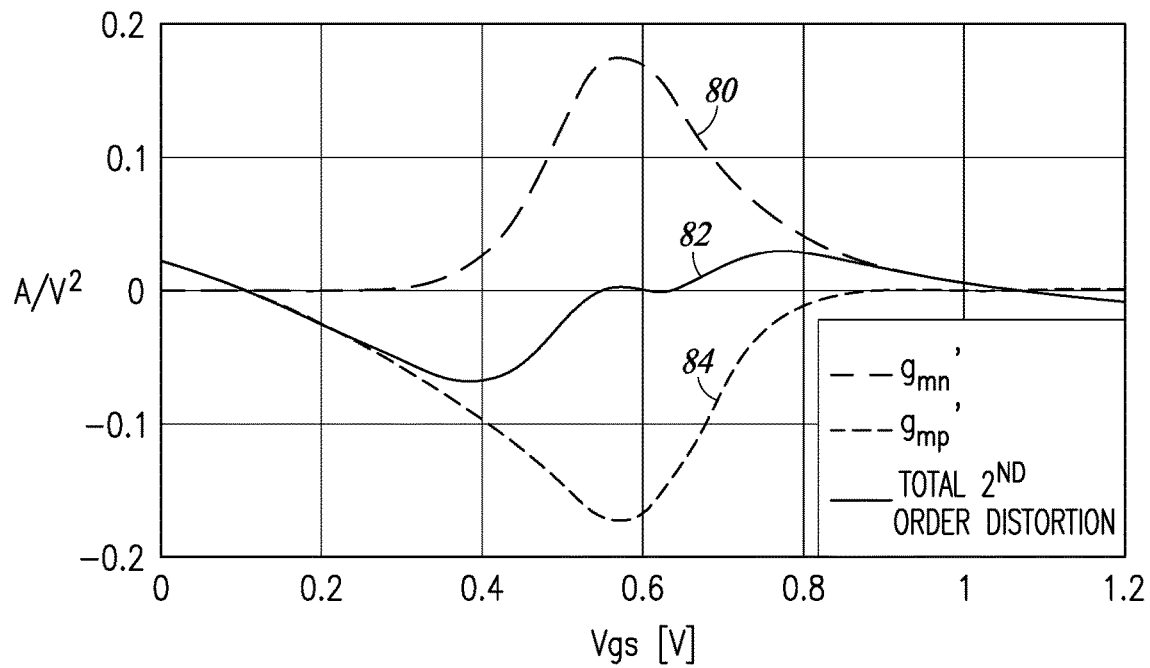
FIG. 9 is a graph illustrating second order nonlinear component of pMOS and nMOS transistors.

A graph illustrating second order nonlinear component of pMOS and nMOS transistors is shown in FIG. 9. As shown, using pMOS and nMOS transistors at the output stage causes the second-order nonlinear components, $g'_{mp}$, and $g'_{mn}$, to neutralize each effect in a range of the bias voltage. As a result, the second-order nonlinear term is attenuated and both IIP2 and IIP3 are improved. By using this technique, the linearity of the CS transistor is improved. To improve the linearity of the CG transistor, this transistor is biased in the sweet spot.

Figure 10:
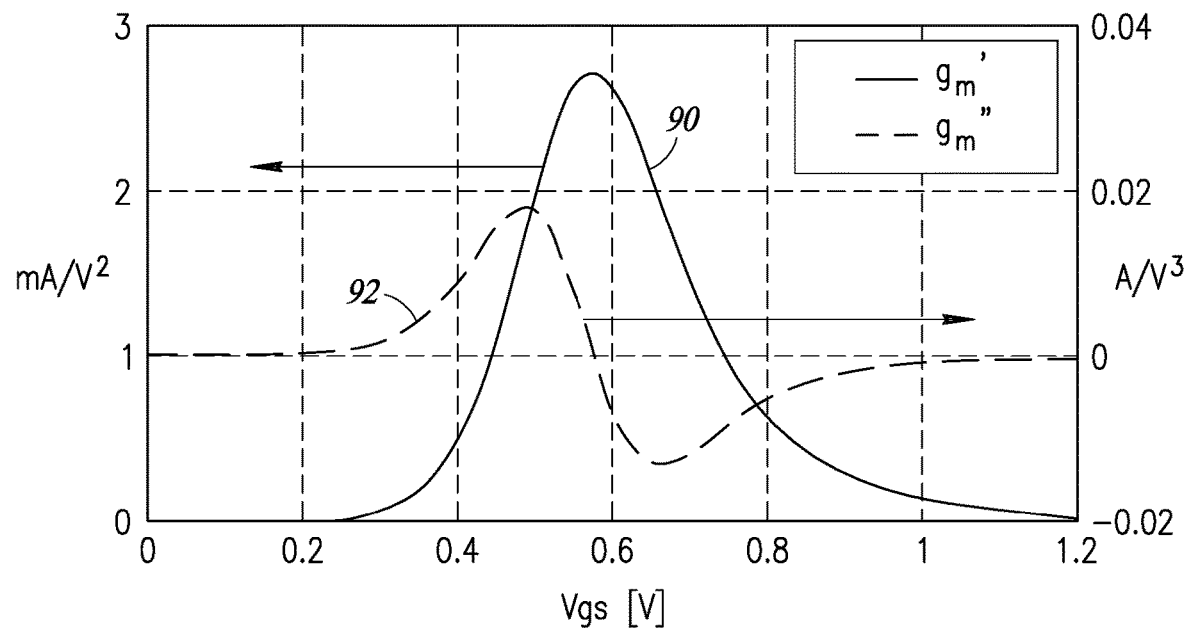
FIG. 10 is a graph illustrating second and third order derivatives of the drain source dc current $i_{ds}$ with response to $V_{gs}$.

A graph illustrating second and third order derivatives of the drain source dc current $i_{ds}$ with response to $V_{gs}$ is shown in FIG. 10. As shown, by biasing the transistor with an appropriate voltage in which the third-order nonlinear component of the CG transistor, $g'''_m$, is equal to zero, the IIP3 of the common-gate structure can be improved. A drawback of the sweet spot technique is its sensitivity to the process corners. The constant $g_m$ biasing circuit is used in the proposed LNA structure in order to deal with the problem of sweet spot technique because the constant $g_m$ biasing is less sensitive to the process corners and temperature variations. To examine the stability of an LNA with arbitrary source and load impedances, the Stern stability factor defined in Equation 17 below is often utilized:

$$K = \frac{1 + |\Delta|^2 - |S_{11}|^2 - |S_{22}|^2}{2|S_{21}||S_{12}|} \quad (17)$$

where $\Delta = S_{11}S_{22} - S_{12}S_{21}$ and $S_{11}$, $S_{22}$, $S_{21}$, and $S_{12}$ are the input return loss, output return loss, forward gain, and reverse gain, respectively. If $K>1$ and $\Delta<1$, then the circuit is unconditionally stable. According to Equation 17, the stability of the circuit is improved by maximizing the reverse isolation.

The LNA 70 of FIG. 7 has been implemented in 28 nm CMOS technology over 0.1 to 7.3 GHz. By carefully sizing of the transistors and using the noise cancellation and reduction techniques (i.e. dc current reuse technique), it is possible to operate this amplifier with a power dissipation of 6.25 mW from a 1.05 V power supply while achieving relatively high and flat small-signal gain and a very low noise figure over the entire bandwidth. The S-parameters, noise figure, IIP2 and stability of the proposed LNA are simulated. This wideband LNA provides 15 dB maximum power gain with a NF of 2.7 dB in worse case.

Figure 11:
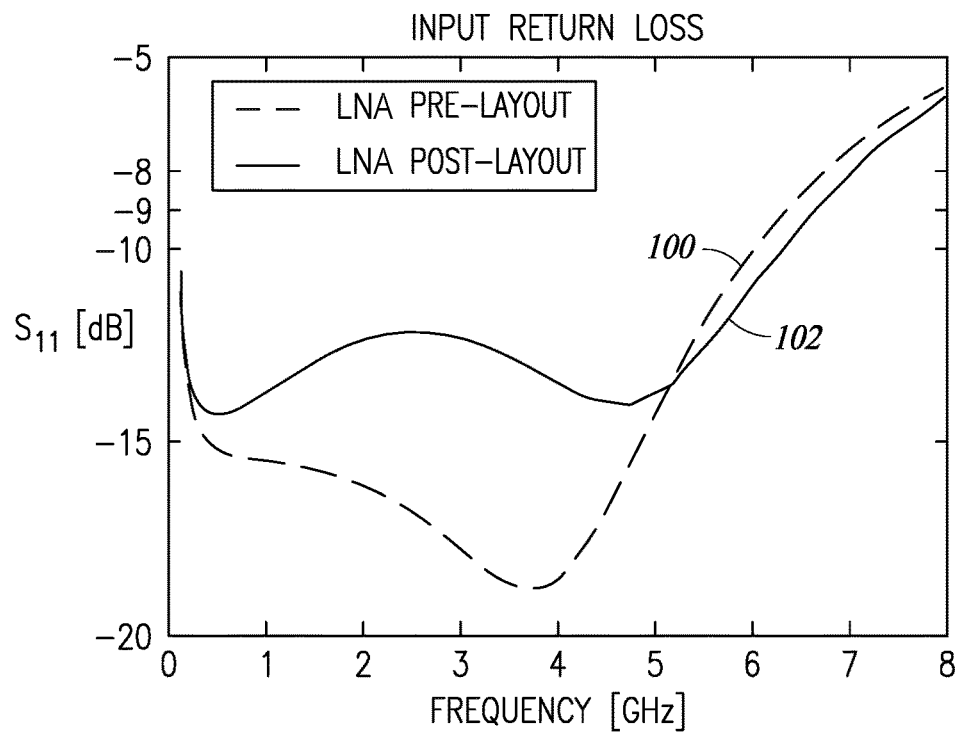
FIG. 11 is a graph illustrating simulated input return loss.

A graph illustrating simulated input return loss including S-parameters of the LNA is shown in FIG. 11. As shown, the minimum input return loss is around 500 MHz, which means the input impedance is matched at that frequency. Although the input return loss is higher away from this point, the wideband input matching feature is well controlled below −10 dB in the whole bandwidth. As it is anticipated, the input return loss becomes worse because the paralleled transistor $M_4$ adds extra parasitic capacitances to the input node.

Figure 12:
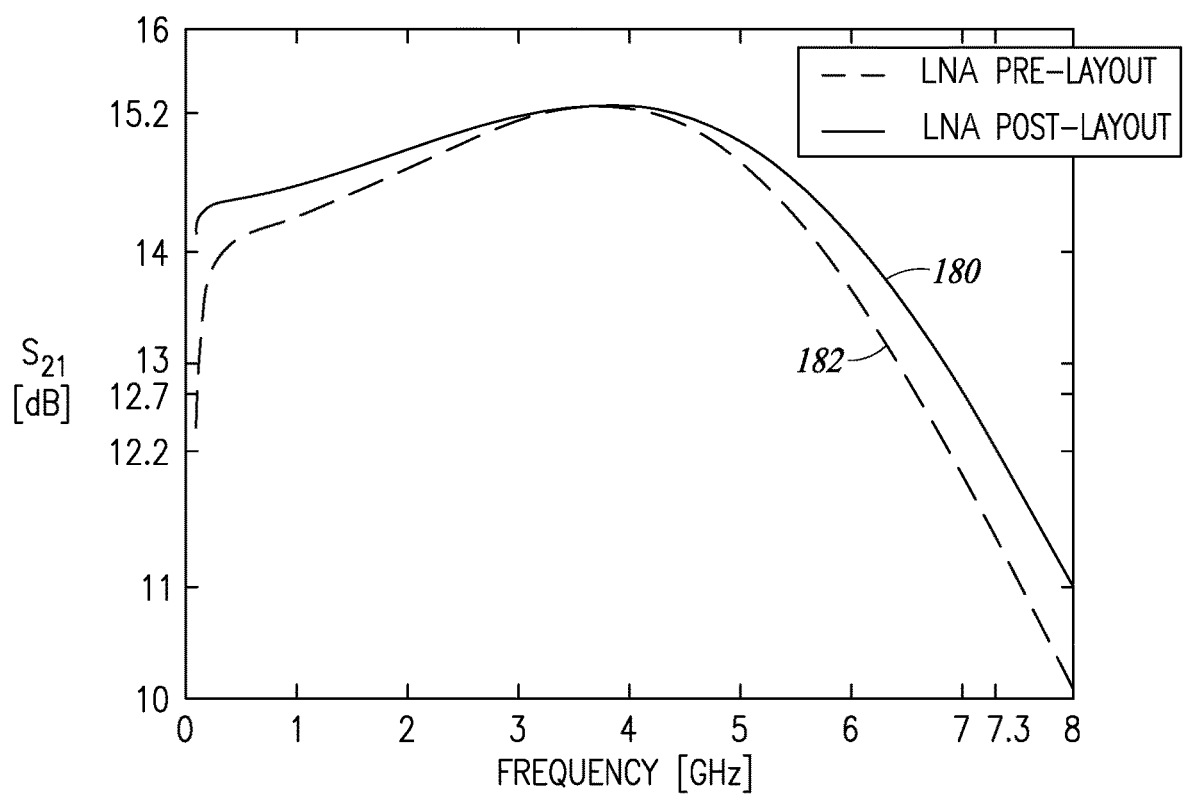
FIG. 12 is a graph illustrating simulated power gain as a function of frequency.

A graph illustrating a simulation of power gain as a function of frequency is shown in FIG. 12. As shown, the noise figure is shown as trace 112 and $S_{21}$ as trace 110. The power gain varies between 12.2-15.2 dB in 100 MHz up to 7.3 GHz. As shown, adding transistor $M_4$ causes an increase in the second stage transconductance in the LNA resulting in 2 dB more power gain which is expected from the Equation 9. Since the drain of three transistors $M_2$, $M_3$, $M_4$ are connected to the output node, the total parasitic capacitance in this node is increased. Hence, the −3 dB bandwidth of the LNA is decreased. One solution to alleviate this is to use a shunt-peaking inductor at the output node in order to damp the total parasitic capacitance and smooth the gain. This, however, also increases the on-chip area of the LNA.

Figure 13:
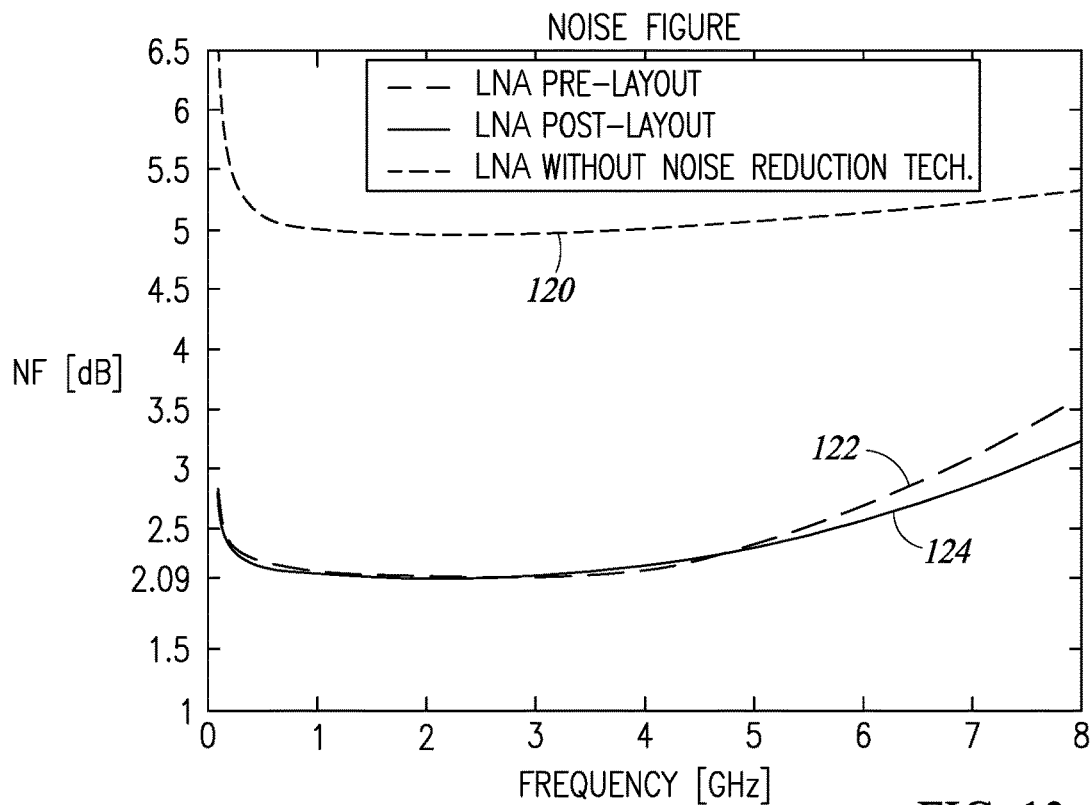
FIG. 13 is a graph illustrating simulated noise figure as a function of frequency.

The NF of the LNA of the present invention is shown in FIG. 13. By applying the noise reduction technique, the NF has been decreased by 25% because the transconductance of $M_2$ is boosted and its thermal noise effect is reduced. The noise figure of the LNA varies from 2 dB to 2.7 dB in the 7.2 GHz bandwidth.

Figure 14:
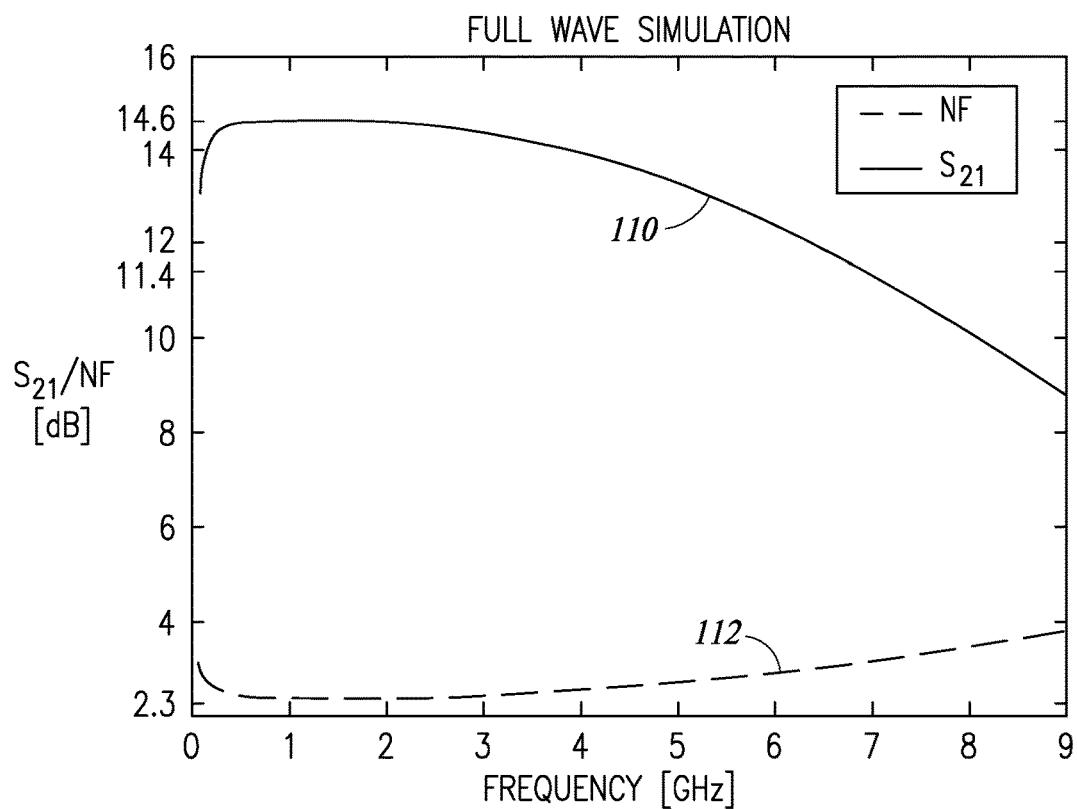
FIG. 14 is a graph illustrating a full wave simulation of noise figure and power gain as a function of frequency.

A graph illustrating a full wave simulation of noise figure and power gain as a function of frequency is shown in FIG. 14. In full wave analysis, all the interconnections and passive devices are accurately RLC extracted from 0 to 20 GHz using an electromagnetic tool such as Solidworks EMS magnet and electromagnetic software simulation product from Dassault Systems, Paris, France. Then they are used with RC extracted from active devices to do full wave simulation. As shown, the noise figure is represented as trace 112 and $S_{21}$ as trace 110. The power gain $S_{21}$ varies between 11.6 to 14.6 dB in 100 MHz up to 7.3 GHz. The minimum amount of the noise figure is approximately 2.3 dB.

Figure 15:
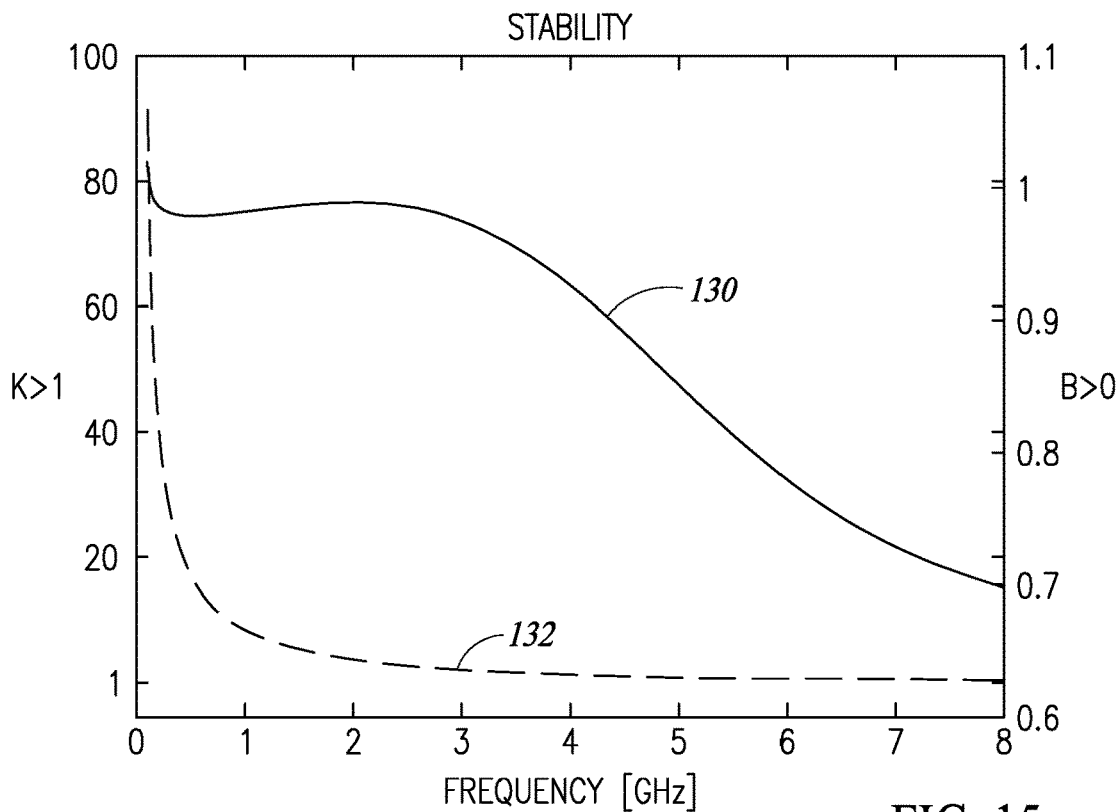
FIG. 15 is a graph illustrating stability of the simulated LNA as a function of frequency.
Figure 16:
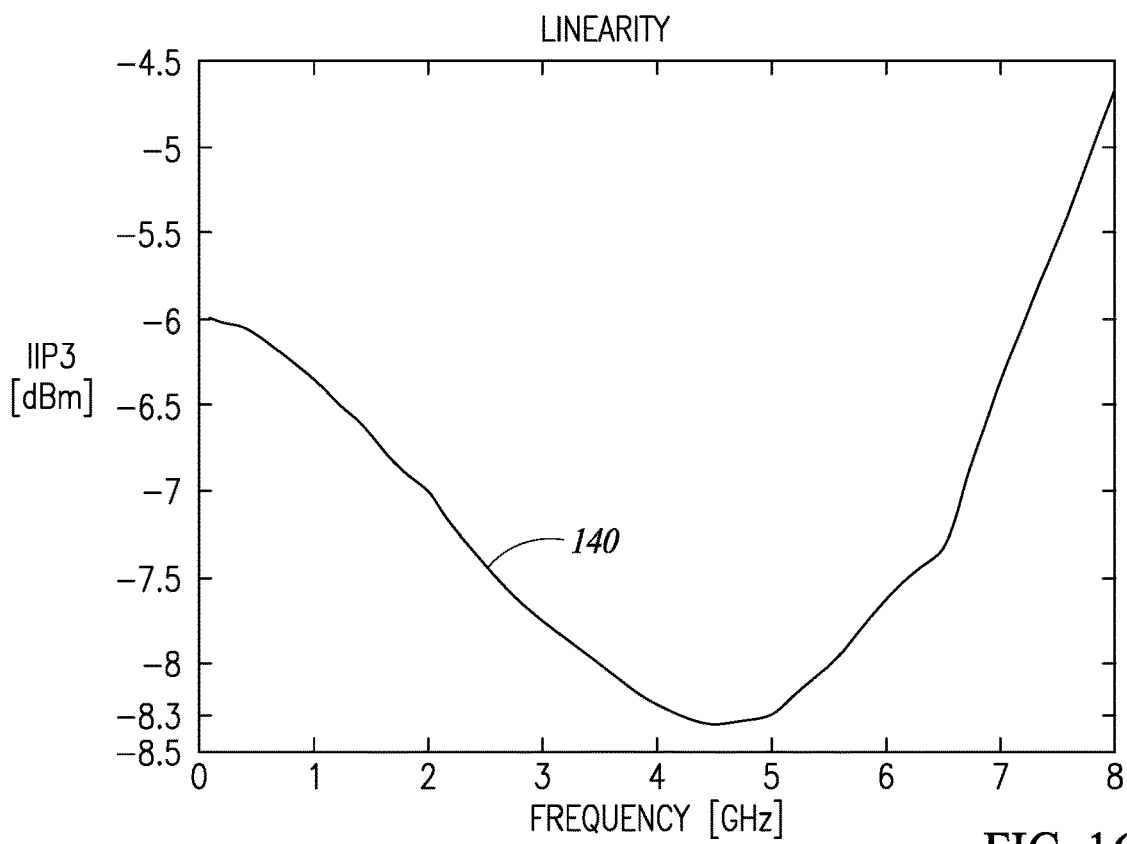
FIG. 16 is a graph illustrating simulated IIP3 as a function of frequency.

To determine stability, the simulated Stern stability factor K (trace 132) and A (trace 130) are illustrated in FIG. 15. As indicated, over the whole bandwidth, K>1 and A<1 resulting in guaranteed stability of the simulated LNA. Finally, a two-tone RF signal sweeping from 100 MHz up to 7.3 GHz is used to simulate the linearity performance of the LNA. As shown in FIG. 16, the simulated IIP3 (trace 140) is −4 dBm in the middle of the bandwidth. A summary of the LNA including a figure of merit (FoM) is summarized below in Table 1.

TABLE 1

| LNA Summary and FoA | |
|---|---|
| CMOS Tech. [nm] | 28 |
| BW [GHz] | 0.1~7.3 |
| $S_{11}$ [dB] | <−10 |
| $S_{21}$ [dB] | 12.2~15.2 |
| IB-IIP3 [dBm] | −4~−8 |
| NF [dB] | 2~2.4 |
| VDD [V] | 1.05 |
| Power [mW] | 6.5 |
| Active Area [mm$^2$] | 0.024 |
| FoM$_1$ | 12.63 |

$$FOM_1 = \frac{Gain_{av}[abs] \times BW[GHz]}{(F_{av} - 1) \times P_{dc}[mW]} \quad (18)$$

$$FOM_2 = \frac{Gain_{av}[abs] \times BW[GHz] \times IIP3[mW]}{(F_{av} - 1) \times P_{dc}[mW]} \quad (19)$$

Where $Gain_{av}$ is the average power gain, $F_{av}$ is the average noise factor over the frequency range and $P_{dc}$ is the power consumption. According to Table 1, the LNA provides a relatively low noise figure and has acceptable power consumption for 7.3 GHZ bandwidth which is achieved by using both noise reduction and cancellation techniques. Moreover, the circuit has a comparable linearity and quite high power gain. Nonetheless, the outstanding FoM makes the circuit a good candidate for low noise and low power wideband CMOS transconductance amplifiers.

Note that a goal of the present invention is to provide a noise reduction technique that does not require extra power consumption. This is due to the use of the dc current reuse technique to decrease the noise of the circuit.

Figure 17:
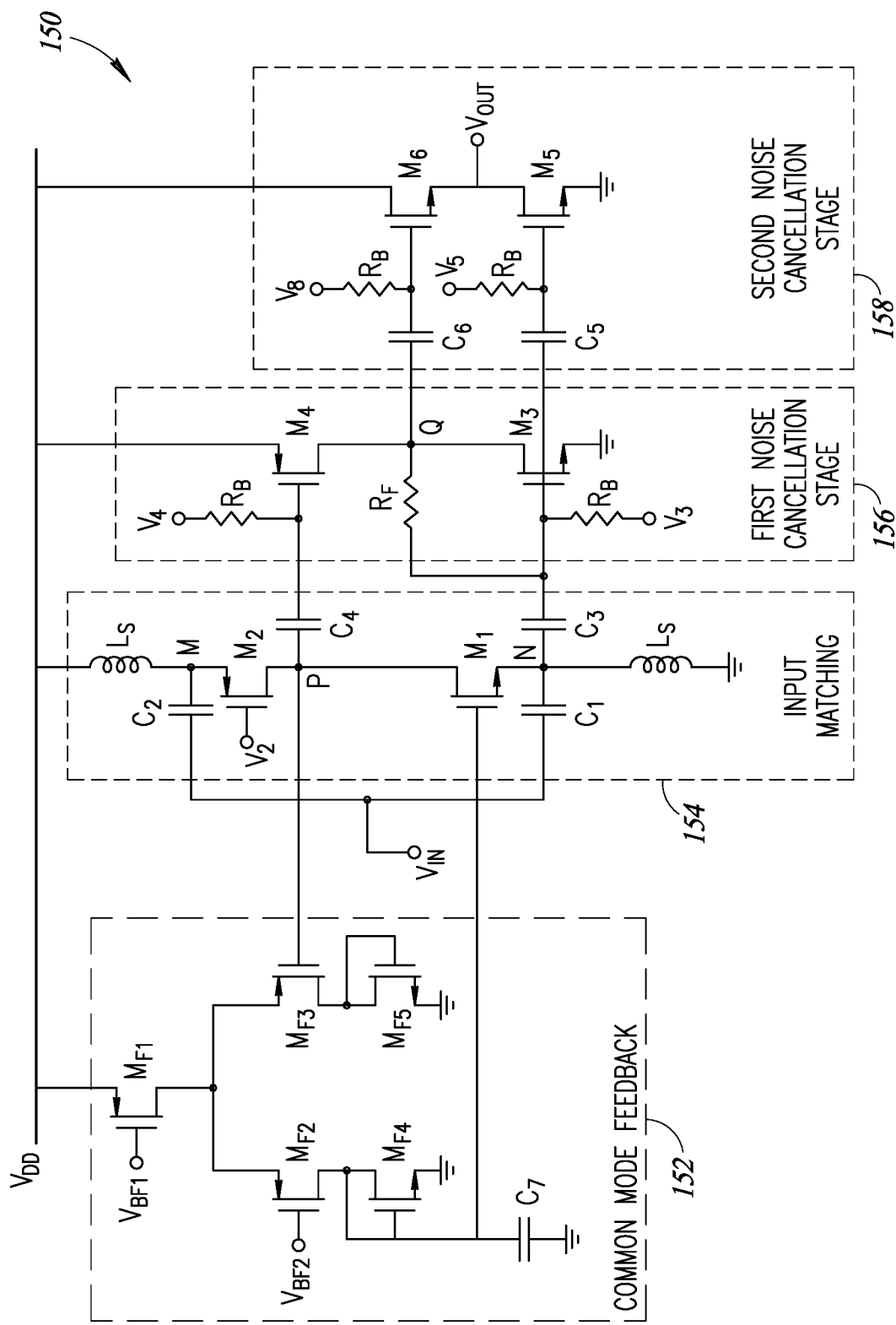
FIG. 17 is a schematic diagram illustrating a two-fold noise cancelling LNA of the present invention.

In an alternative embodiment, three stages are used to realize inductor-less two-fold noise cancellation to further lower the noise figure while extending the bandwidth. A schematic diagram illustrating a two-fold noise cancelling LNA of the present invention is shown in FIG. 17. The circuit, generally referenced 150, comprises a common mode feed block 152, input matching block 154, first noise cancellation stage 156, and second noise cancellation stage 158.

In this structure, $M_1$ is used as the CG structure for implementing the broadband input matching. $M_2$ is paralleled with $M_1$ in order to reduce the current of first stage and increase the overall transconductance $g_m$. The second stage is an NC complementary CS topology of $M_3$ and $M_4$. A pMOS-nMOS complementary pair is used in both first and second stages to improve linearity as well as to enhance linearity (IIP3) via a "sweet spot biasing technique". The latter technique is also utilized in the additional, i.e. third, stage.

Using the noise cancellation technique, the most important noise source, i.e. the channel thermal noise of CS transistors in the second stage, is addressed. In order to deal with this challenge, the third stage, $M_5$ and $M_6$, is utilized to cancel the channel thermal noise of $M_3$ and $M_4$, i.e. the first noise cancellation stage. Inductance $L_s$ is used in the source of $M_1$ and $M_2$ to provide a dc current path and cancel the degrading effect of the parasitic capacitances of transistors $M_1$, $M_2$ and $M_3$. Since the P and Q nodes are the high impedance node, their voltage varies. The transistors $M_{F1}$ to $M_{F5}$ are employed to provide the variation of voltage in P node. Moreover, the negative feedback $R_F$ is used to prevent the variation of dc voltage in node Q. Since the Miller effect of $R_F$ is much larger than the input and output impedances, its effect is ignored in all analysis.

Regarding, dc biasing, a constant $g_m$ biasing circuit is used to bias the transistors. Two external source inductors $L_s$ provide a dc path for the bias current of the first stage. Two nMOS and pMOS branches are used in first and second stages which can cause the dc voltages of P and Q nodes to vary. In other words, the P and Q nodes are of high impedance which may cause the transistors to inadvertently enter the linear region. For the first stage, common-mode feedback circuitry is utilized to define the drain dc voltage of transistors $M_1$ and $M_2$. This circuit realized by transistors $M_{F1}$ to $M_{F5}$ in block 152. The voltage variation of P node is compensated by variation of gate-source voltage of $M_1$. In addition, $C_7$ sets the ac ground for the gate of $M_1$ so the feedback path regulates the bias output voltage. In addition, the resistive feedback $R_F$ is used to handle the variations of dc voltage at node Q. As mentioned supra, the size of $R_F$ is assumed high, therefore, the dc voltage at node Q is approximately equal to $M_3$'s gate-source voltage $V_{gs3}$.

Regarding input matching, the LNA input must be matched to the specific reference impedance $Z_0=50\Omega$ to not affect the preceding stage (e.g., the antenna). The quality of input matching is judged by the S-parameter $S_{11}$ defined as:

$$S_{11} = \left| \frac{Z_{in} - Z_0}{Z_{in} + Z_0} \right| \tag{20}$$

where $Z_{in}$ is the input impedance of the LNA. The value of $S_{11}$ is preferably <−10 dB.

The complementary common gate (CG) transistors, $M_1$ and $M_2$, are used in the first stage to realize the wideband input matching. Since they are in parallel at ac (i.e. mid frequencies), their transconductances add and their combined input impedance becomes $1/(g_{m1}+g_{mb1}+g_{m2}+g_{mb2})$. This value is, to the first order, independent of frequency. Due to the current being reused, the structure provides the required input matching at a much lower current.

To simplify the following notation, we lump the body effect into the main transconductance $g_m$. Hence, $g_{m1}$ and $g_{m2}$ stand for $g_{m1}+g_{mb1}$ and $g_{m2}+g_{mb2}$, respectively. The input impedance is calculated as:

$$Z_{in} = \frac{1}{2}(R_{Ls} + sL_s) \left\| \frac{1}{sC_N} \right\| \frac{1}{g_{m1}+g_{m2}} = \\ \frac{R_{Ls}+sL_s}{C_N L_s s^2 + (R_{Ls}C_N + (g_{m1}+g_{m2})L_s)s + ((g_{m1}+g_{m2})R_{Ls}+1/2)} \tag{21}$$

where $R_{Ls}$ is a series resistance of $L_s$. Since $M_1$ and $M_2$ are in parallel at ac, the parasitic capacitance at node N is added to that of node M. $C_N$ denotes the total parasitic capacitance seen by the input node which is damped by $L_s$. According to Equation 20, the input matching condition, $S_{11}$<−10 dB, will be achieved if $|Z_{in}|$ is around 50Ω. As stated by Equation 21, at mid frequencies, the input impedance is ~$1/(g_{m1}+g_{m2})$. At low frequencies, the input matching can be effectively influenced by $R_{Ls}$. The value of $L_s$ should be increased up to 150 nH to ensure the input matching. If the size of $L_s$ decreases, $R_{Ls}$ will also decrease due to the limited quality factor of $L_s$ (approximately up to 5Ω). Therefore, this resistance is paralleled with $1/(g_{m1}+g_{b1})$ and lowers the equivalent input impedance. Note that in one embodiment, inductance $L_s$ is an off-chip component.

Regarding gain analysis, three stages are used in the LNA structure which provides significant gain. The second stage is the most effective stage to provide gain and thus consumes more current than other branches. Since the first stage preferably provides input matching condition, it draws less current. Therefore, its voltage gain could not be high enough. In addition, the third stage functions as a buffer and cannot increase gain effectively.

The equivalent impedance, seen from the drain of $M_1$ toward the ground, is called $Z_P$ and it is equal to $r_{ds1} \| r_{ds2} + (R_s \| 1/sC_N \| sL_s/2)((g_{m2}+g_{m1})r_{ds1} \| r_{ds2})] \| sC_P$ where $R_s$ is the source resistance and $C_P$ is the total parasitic capacitance in node P. $Z_Q$ is equal to $r_{ds2} \| r_{ds3} \| 1/sC_Q$ where $C_Q$ is the entire parasitic capacitor in node Q. $Z_{out}$ is defined as the output impedance which is calculated as $r_{ds5} \| r_{ds6} \| 1/g_{m6} \| 1/sC_{out}$ where $C_{out}$ is the output parasitic capacitance. The voltage gain of LNA is calculated as:

$$A_v = \left( \frac{1/(g_{m1}+g_{m2})}{1/(g_{m1}+g_{m2})+R_s} \right) \times [((g_{m1}+g_{m2})g_{m4}|Z_P|+g_{m3})g_{m6})|Z_{out}| \tag{22}$$

The voltage gain of the proposed LNA without considering the third stage, $A_v'$, is equal to: $A_v'=\beta Z_Q$ which $\beta$ is equal to $(½)[g_{m3}+(g_{m1}+g_{m2})g_{m4}(r_{ds1} \| r_{ds2})]$. As stated by the transfer function of $Z_Q$, the dominate pole causes the $Z_Q$ to have a large variation (the $Z_Q$ roll off happens at low frequencies) so −3 dB bandwidth decreases. By applying the third stage, the voltage gain is equal to: $A_v=(g_{m6}\beta Z_Q+g_{m3})Z_{out}$. The transconductance of $M_5$ is added to $A_v'$ which creates a zero after dominate pole and naturalizes its effect. This zero makes the $Z_Q$'s variation become smooth so the high edge of bandwidth is extended.

Regarding noise analysis, in the LNA 150, double noise cancellation techniques are utilized to enhance the noise figure. One noise cancellation technique is applied for the CG structure which is conventional noise cancellation and another one is used for CS transistors in the second stage. The two noise cancellation techniques will now be explained.

In a first noise cancellation block 156 for CG transistors, as described supra, since the CG structure has high NF, a noise cancellation technique is applied to cancel the noise effect of the input transistors. The current noise of the input transistors flow into the input node N or M node but out of the node P that creates two voltages with opposite phases. These two voltages are converted to current by $M_3$ and $M_4$. The input signal in these two nodes, however, has the same phases. Thus, the input signal is boosted at the output. These two voltages are calculated as $\overline{V}_{nN}^2 = Zin^2 \cdot \overline{I}_{n,M1}^2$ and $\overline{V}_{nP}^2 = -Z_P^2 \cdot \overline{I}_{n,M1}^2$, thus, the current noise after passing through the cancellation stage $I_{n2}$ is equal to:

$$I_{n2}^2 = \overline{V}_{nN}^2 g_{m3}^2 - \overline{V}_{nP}^2 g_{m4}^2 = 0 \quad (23)$$

$$= \frac{g_{m3}}{g_{m4}} = \left| \frac{Z_P}{Z_N} \right|$$

To reuse the current of $M_3$, $M_4$ is selected as a pMOS transistor. In this manner, the noise factor of the LNA without considering third stage $F_1$ is equal to $F_1 = 1 + F_{M3} + F_{M4}$. The terms of noise factor are given by following relations:

$$F_{M3} = \quad (24)$$

$$\frac{4kTg_{m3}|Z_Q|^2}{4kTR_s A_v'} \frac{\gamma}{\alpha} = \frac{4g_{m3}}{R_s(|Z_P|(g_{m1}+g_{m2})g_{m4}+g_{m3})^2} \frac{\gamma}{\alpha} \cong \frac{g_{m3}}{R_s(g_{m3})^2} \frac{\gamma}{\alpha}.$$

$$F_{M4} = \frac{4kTg_{m4}|Z_Q|^2}{4kTR_s A_v'} \frac{\gamma}{\alpha} = \quad (25)$$

$$\frac{4g_{m4}}{R_s(|Z_P|(g_{m1}+g_{m2})g_{m4}+g_{m3})^2} \frac{\gamma}{\alpha} \cong \frac{R_s}{|Z_P|^2(g_{m1}+g_{m2})g_{m4}} \frac{\gamma}{\alpha}.$$

where $A'_v$ is the voltage gain of the LNA without considering the third stage, $\gamma$ is the excess noise factor in short channel devices, and $\alpha$ is the ratio of the transconductance $g_m$ to the zero-bias drain conductance $g_{d0}$. Since the parasitic capacitances in input node $C_N$ are almost damped by $L_s$, the relations $Z_{in} = R_s = 1/(g_{m1}+g_{m2})$ is assumed. Thus, $F_1$ is approximately given by:

$$F \cong 1 + \frac{\gamma}{\alpha R_s g_{m3}} + \frac{\gamma R_s}{\alpha |Z_P|^2(g_{m1}+g_{m2})g_{m4}} \quad (26)$$

As indicated by Equation 26, the noise performance of the LNA is improved by cancelling the noise effect of $M_1$ and $M_2$, i.e. matching transistors, whereas the thermal noise of $M_{3,4}$, i.e. common source transistors, influence the factor noise effectively. Therefore, the second noise cancellation technique functions to cancel out the noise of $M_{3,4}$ and achieve improved noise performance.

In a second noise cancellation block 158 for CS transistors, the noise current of the transistor $M_3$ flows through the feedback resistor $R_F$ to the node N and instantaneously creates two noise voltages with the same phase but different amplitudes in nodes N and Q. On the other hand, the signal voltage at these nodes has opposite phase and different amplitude due to the inverting amplifier. The difference between the signal and noise polarities at nodes N and Q makes it possible to cancel the $M_3$ noise while adding the signal contributions constructively. The noise voltage in node N $\overline{V}{n_N}^2$ is amplified and inverted by $M_5$ and also the noise voltage in node Q $\overline{V}_{nQ}^2$ is passed across $M_6$ without any change. Then in the output $V_{out}$ two voltages with opposite phases are added. Therefore, the channel thermal noise of $M_3$ will be canceled at the output provided the following condition is satisfied:

$$\overline{V}_{nout}^2 = \overline{V}_{nQ}^2 g_{m6}^2 |Z_{out}|^2 - \overline{V}_{nN}^2 g_{m5}^2 |Z_{out}|^2 = 0 \quad (27)$$

$$\frac{g_{m5}}{g_{m6}} = \frac{(R_F + R_s/2) \| |Z_Q|}{R_s/2}$$

where $g_m r_{ds} \gg 1$ is assumed. The terms of noise factor in the LNA are given by the following relations in which the two noise cancellation conditions in Equations 23 and 27 are applied to simplify the relations:

$$F_{M5} = \frac{4kTg_{m5}|Z_{out}|^2}{4kTR_s A_v} \frac{\gamma}{\alpha} \quad (28)$$

$$= \frac{\gamma 4 g_{m5}}{\alpha R_s[(|Z_P|(g_{m1}+g_{m2})g_{m4}+g_{m3})g_{m6}|Z_Q|+g_{m5}]^2}$$

$$\cong \frac{4}{R_s g_{M5}(|Z_P|g_{m4}+1)^2} \frac{\gamma}{\alpha}.$$

$$F_{M6} = \frac{4kTg_{m6}|Z_{out}|^2}{4kTR_s A_v} \frac{\gamma}{\alpha} \quad (29)$$

$$= \frac{\gamma 4 g_{m6}}{\alpha R_s[(|Z_P|(g_{m1}+g_{m2})g_{m4}+g_{m3})g_{m6}|Z_Q|+g_{m5}]^2}$$

$$\cong \frac{R_s}{(|Z_P|g_{m4}+1)^2|Z_Q|^2} \frac{\gamma}{\alpha}.$$

where $Z_{out}$ is output impedance and was mentioned supra and $(R_F + R_s/2) \gg Z_Q$ is assumed. Finally, the total noise factor of the LNA 150 is given approximately by:

$$F \cong 1 + \frac{4\gamma}{\alpha R_s g_{m5}(Z_P g_{m4}+1)^2} + \frac{\gamma R_s}{\alpha(Z_P g_{m4}+1)^2|Z_Q|^2} \quad (30)$$

As stated by Equation 30, the channel thermal noise of third stage is added to the circuit. But the effect of the third and fourth terms of Equation 30, i.e. the noise effect of the third stage compared to the input, is very small because it is divided over the total voltage gain of the LNA and therefore has the least influence on total noise factor. Therefore, it is expected that the LNA 150 has a very low noise figure by use of the noise cancellation. One drawback of the circuit 150, however, is extra circuit branch which slightly increases power consumption.

Regarding linearity of the LNA, by applying the two noise cancellation techniques, both linearity and noise performance of circuit improve. Nonlinearity of CG transistors can be modeled as a current source between their drain and source controlled by both $V_{gs}$ and $V_{ds}$. As described supra, this nonlinear current produces two voltages in opposite phase in node N and P which neutralize each effect by using noise cancellation stage, i.e. $M_3$ and $M_4$. Although this technique can cancel all intrinsic distortion generated by $M_1$ and $M_2$, including both $g_m$ and $g_{ds}$ non-linearity, $M_{3,4}$'s distortion dominates the residual nonlinearity. Nonlinearity of CS transistors $M_3$ and $M_4$ can be modeled as a current between their drain and source too. By passing this current through $R_F$ and $R_s$ two nonlinear voltages are created. These two voltages are cancelled each effect by using third stage as second noise cancellation.

Moreover, a pMOS-nMOS pair is used in both first and second stages in order to improve the IIP3. The input pMOS and nMOS transistors are biased in a way that the second nonlinear component of $M_1$ and $M_2$ cancel each other's effects within range of the bias voltage. In addition, the linearity of CS transistor $M_3$ is improved by attenuating its second nonlinear term via the pMOS-nMOS structure. By using both the noise cancellation technique and pMOS-nMOS structures, the distortion of CS transistor in third stage $M_5$ is the dominant component of the proposed structure's nonlinearity. To address this challenge, $M_5$ is biased in the sweet spot. In the sweet spot, the third nonlinear component of $M_5$ is equal to zero and hence its linearity is improved. As a result, the IIP3 of the LNA is improved.

The LNA 150 of FIG. 17 has been implemented in 28 nm CMOS technology. By using double noise cancellation techniques, it is possible to achieve reasonably high and flat small signal gain and low noise figure in the whole of requisite bandwidth.

Figure 18:
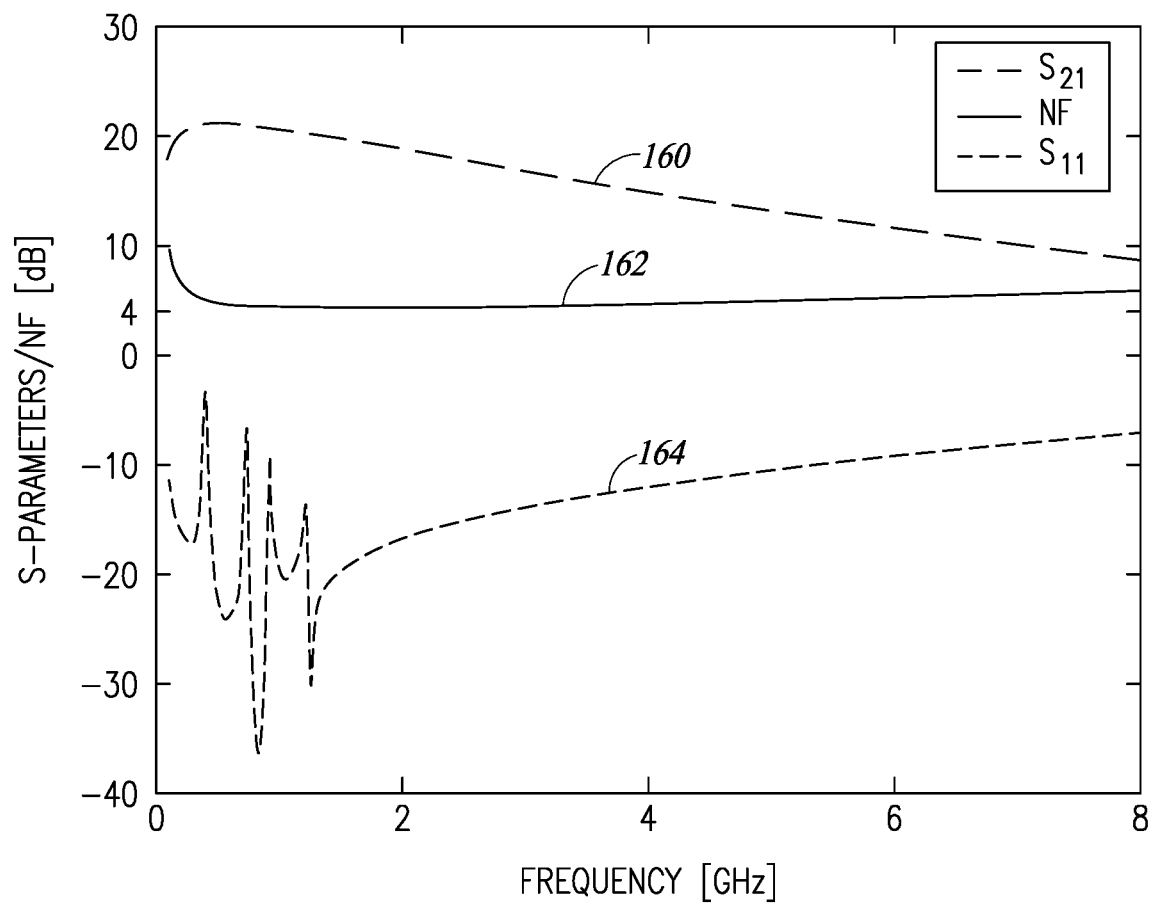
FIG. 18 is a graph illustrating simulated power gain, input return loss and noise figure as a function of frequency.

The simulation results of the proposed LNA are shown in FIG. 18. In accordance with FIG. 18, the power gain $S_{21}$ is shown as dashed trace 160, the noise figure (NF) as solid trace 162, and the input return loss $S_{11}$ as dotted trace 164. Using CG transistors in the input stage provides an acceptable $S_{11}$ comparable to state of the art designs. The results show a value of $S_{11}$ below −10 dB over 0.1 to 4.5 GHz bandwidth. By using the third stage, the parasitic capacitances of $M_5$ are added to the total capacitance in input node thereby deteriorating $S_{11}$. But, as indicated by FIG. 18, the wideband input matching characteristic is well controlled below −10 dB across the entire bandwidth.

The −3 dB bandwidth power gain is illustrated in FIG. 18 as well. The maximum power gain is 21 and −3 dB bandwidth is achieved in 0.1 to 3 GHz bandwidth. By adding the third stage, the power gain is increased which is expected as stated by Equation 10. As described supra, the third stage creates a zero which accomplishes the bandwidth extension. The bandwidth of the LNA without the third stage ranges from 200 MHz up to 1.2 GHz. By utilizing the third stage, the −3 dB bandwidth is extended to 3 GHz.

The proposed LNA has relatively high power gain while achieving a low noise performance by drawing only 6.5 mA current from 1.05 V supply voltage. In addition, the LNA occupies a relatively very small area since it is inductor-less.

Those skilled in the art will recognize that the boundaries between logic and circuit blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:
1. A low noise amplifier (LNA) circuit, comprising:
an input node for receiving an input signal;

an input matching stage coupled to said input node and operative to provide wideband input matching;

a noise cancellation stage coupled to said input matching stage and operative to substantially cancel thermal current noise generated by said input matching stage and to generate an output signal thereby; and a noise reduction stage coupled to said input matching stage and in parallel with said noise cancellation stage in ac mode, said noise reduction stage operative to reduce thermal current noise of said noise cancellation stage by boosting transconductance of said noise cancellation stage and hence reducing its thermal noise effects.

2. The circuit according to claim 1, further comprising a $g_m$ boosting stage coupled to said input matching stage.

3. The circuit according to claim 1, wherein said noise reduction stage comprises a pMOS transistor.

4. The circuit according to claim 1, wherein said noise cancellation stage comprises a common source amplifier transistor.

5. The circuit according to claim 1, wherein said noise cancellation stage and said noise reduction stage are operative to utilize dc current reuse resulting in ac paralleling of a noise reduction stage transistor with a noise canceling stage transistor thereby summing their transconductances and reducing thermal noise without required additional power consumption.

6. The circuit according to claim 1, wherein said noise cancellation stage comprises a pMOS-nMOS structure with sweet spot biasing applied to improve linearity.

7. The circuit according to claim 1, wherein said noise cancellation stage is operative to generate two in phase signal currents which are summed to generate an amplified output signal whereby two out of phase noise currents are canceled.

8. A noise reduction method for use in a low noise amplifier (LNA), the method comprising:

receiving an input signal at an input node;

wideband matching the input signal utilizing an input matching stage;

canceling thermal current noise generated by said input matching stage utilizing a noise cancellation stage and generating an output signal therefrom; and reducing thermal current noise generated by said noise cancellation stage utilizing a noise reduction stage configured in parallel to said noise cancellation stage in ac mode whereby thermal current noise is reduced by boosting transconductance of said noise cancellation stage and hence reducing its thermal noise effects.

9. The method according to claim 8, further comprising using dc current reuse in said noise cancellation stage resulting in ac paralleling of a noise reduction stage transistor with a noise canceling stage transistor thereby summing their transconductances and reducing thermal noise.

10. The method according to claim 8, wherein said noise cancellation stage is operative to generate two in phase signal currents which are summed to generate an amplified output signal whereby two out of phase noise currents are canceled.

11. A low noise amplifier (LNA) circuit, comprising:

an input node for receiving an input signal;

an input matching stage coupled to said input node and operative to provide wideband input matching;

a first noise cancellation stage coupled to said input matching stage and operative to substantially cancel thermal current noise generated by said input matching stage; and a second noise cancellation stage coupled to said first noise cancellation stage and operative to substantially cancel thermal current noise generated by said first noise cancellation stage and to generate an output signal thereby.

12. The circuit according to claim 11, further comprising a common mode feedback stage coupled to said input matching stage.

13. The circuit according to claim 11, wherein said input matching stage comprises a common gate transistor structure.

14. The circuit according to claim 11, wherein said first noise cancellation stage comprises first and second transistors having a common source topology.

15. The circuit according to claim 11, wherein said second noise cancellation stage comprises first and second transistors having a common source/source follower topology operative to cancel the channel thermal noise of said first noise cancellation stage.

16. The circuit according to claim 11, wherein said first and second noise cancellation stages comprise a pMOS-nMOS transistor structure.

17. The method according to claim 8, wherein said noise cancellation stage comprises a pMOS-nMOS structure with sweet spot biasing applied to improve linearity.

18. The method according to claim 8, wherein said noise cancellation stage comprises a common source amplifier transistor.

19. The method according to claim 8, wherein canceling thermal current noise comprises generating two in phase signal currents which are summed to generate an amplified output signal whereby two out of phase noise currents are canceled.

20. The method according to claim 8, wherein said noise reduction stage comprises a pMOS transistor.

* * * * *